(12) United States Patent
Wu

(10) Patent No.: US 6,528,843 B1
(45) Date of Patent: Mar. 4, 2003

(54) SELF-ALIGNED SPLIT-GATE FLASH MEMORY CELL HAVING A SINGLE-SIDE TIP-SHAPED FLOATING-GATE STRUCTURE AND ITS CONTACTLESS FLASH MEMORY ARRAYS

(75) Inventor: Ching-Yuan Wu, Hsinchu (TW)

(73) Assignee: Silicon Based Technology Corp. (TW)

( * ) Notice: Subject to any disclaimer, the term of this patent is extended or adjusted under 35 U.S.C. 154(b) by 0 days.

(21) Appl. No.: 10/137,286

(22) Filed: May 3, 2002

(51) Int. Cl.[7] .............................................. H01L 29/788
(52) U.S. Cl. ...................... 257/315; 257/316; 257/317; 257/319; 257/320; 257/321
(58) Field of Search ................................ 257/315, 316, 257/317, 319, 320, 321; 438/263, 264, 594

(56) References Cited

U.S. PATENT DOCUMENTS

| 5,242,848 | A | | 9/1993 | Yeh |
|---|---|---|---|---|
| 5,801,414 | A | | 9/1998 | Shinmori |
| 5,989,960 | A | | 11/1999 | Fukase |
| 6,103,573 | A | | 8/2000 | Harari et al. |
| 6,133,097 | A | * | 10/2000 | Hsieh et al. ................. 438/266 |
| 6,208,557 | B1 | | 3/2001 | Bergemount et al. |
| 6,221,716 | B1 | | 4/2001 | Lee et al. |

* cited by examiner

*Primary Examiner*—Tom Thomas
*Assistant Examiner*—Thien F Tran

(57) ABSTRACT

A self-aligned split-gate flash memory cell of the present invention comprises a planarized control/select-gate conductive layer having a portion formed at least on a second gate-dielectric layer and another portion formed at least on a single-side tip-shaped floating-gate structure being formed on a first gate-dielectric layer, wherein a dielectric layer is formed over the single-side tip-shaped floating-gate structure to act as a first intergate-dielectric layer and a second intergate-dielectric layer is formed over an inner sidewall of the single-side tip-shaped floating-gate structure. The self-aligned split-gate flash memory cell is configured into two contactless array architectures: a contactless NOR-type flash memory array and a contactless parallel common-source/drain conductive bit-lines flash memory array.

20 Claims, 15 Drawing Sheets

US 6,528,843 B1

SELF-ALIGNED SPLIT-GATE FLASH MEMORY CELL HAVING A SINGLE-SIDE TIP-SHAPED FLOATING-GATE STRUCTURE AND ITS CONTACTLESS FLASH MEMORY ARRAYS

FIELD OF INVENTION

The present invention relates to a split-gate flash memory cell and its flash memory array and, more particularly, to a self-aligned split-gate flash memory cell having a single-side tip-shaped floating-gate structure and its contactless flash memory arrays.

DESCRIPTION OF THE RELATED ART

A flash memory cell structure can be basically divided into two categories: a stack-gate structure and a split-gate structure, in which the gate length of a stack-gate structure can be defined by using a minimum-feature-size (F) of technology used and, therefore, the stack-gate structure is often used in existing high-density flash memory system for mass storage applications. The stack-gate flash memory cells can be configured into an array of a matrix form according to the basic logic function, such as NOR-type, NAND-type or AND-type. In general, a stack-gate flash memory cell in a NOR-type or AND-type array is programmed by the channel hot-electron injection (CHEI), however the programming efficiency is low and the programming power is large. Moreover, the gate length of a stack-gate flash memory cell is difficult to be scaled down due to the punch-through effect if the channel hot-electron injection is used as a programming method. For a NAND-type array, the stack-gate flash memory cells are interconnected in series with common-source/drain diffusion regions, the density is high but the read speed is relatively slow as compared to that of a NOR-type array. Moreover, the programming speed of a NAND-type array is relatively slow due to the Fowler-Nordheim tunneling across the thin tunneling-oxide layer between the source/drain diffusion region and the floating gate being used as a programming method.

The split-gate structure having a select-gate region and a stack-gate region offers in general a larger cell size as compared to that of a stack-gate structure and is usually configured to be a NOR-type array. Two typical split-gate flash memory cell structures are shown in FIG. 1A and FIG. 1B. FIG. 1A shows a split-gate flash memory device having the floating-gate layer 11 formed by a local-oxidation of silicon (LOCOS) technique, in which the floating-gate length is defined in general to be larger than a minimum-feature-size of technology used due to the bird's beak formation; the control-gate 15 is formed over a LOCOS-oxide layer 12 and a thicker select-gate oxide layer 14; a poly-oxide layer 13 is formed over a sidewall of the floating-gate layer 11; a source diffusion region 16 and a drain diffusion region 17 are formed in a semiconductor substrate 100 in a self-aligned manner; and a thin gate-oxide layer 10 is formed under the floating-gate 11. The split-gate structure shown in FIG. 1A is programmed by mid-channel hot-electron injection, the programming efficiency is high and the programming power is low as compared to the channel hot-electron injection used by the stack-gate structure. Moreover, the over-erase problem of the split-gate structure can be prevented due to a high threshold-voltage for the select-gate region, so the control logic circuits for erasing and verification can be simplified. However, there are several drawbacks for FIG. 1A: the cell size is larger due to the non self-aligned control-gate structure; the gate length can't be easily scaled down due to the misalignment of the control-gate with respect to the floating-gate; the coupling ratio is low and higher applied control-gate voltage is required for back erase; and the field-emission tip of the floating-gate layer is difficult to be controlled due to the weak masking ability of the bird-beak oxide.

FIG. 1B shows another split-gate structure, in which the floating-gate layer 21 is defined by a minimum-feature-size (F) of technology used; a thin tunneling-oxide layer 20 is formed under the floating-gate layer 21; a select-gate dielectric layer 22 is formed over the select-gate region and the exposed floating-gate layer 21; a control-gate layer 23 is formed over the select-gate dielectric layer 22; and a source diffusion region 24 and a double-diffused drain region 25, 26 are formed in a semiconductor substrate 100. From FIG. 1B, it is clearly visualized that similar drawbacks as listed for FIG. 1A are appeared except that the erasing site is located at the thin tunneling-oxide layer 20 between the floating-gate layer 21 and the double-diffused drain region 25,26.

It is therefore an objective of the present invention to provide a self-aligned split-gate flash memory cell having a cell size being smaller than $4F^2$.

It is another objective of the present invention to provide a higher coupling ratio for a self-aligned split-gate flash memory cell.

It is a further objective of the present invention to provide a reproducible tip-cathode structure for the self-aligned split-gate flash memory cell with a higher field-emission efficiency.

It is yet another objective of the present invention to provide two contactless architectures for self-aligned split-gate flash memory arrays.

Other objectives and advantages of the present invention will be more apparent from the following description.

SUMMARY OF THE INVENTION

A self-aligned split-gate flash memory cell of the present invention is formed on a semiconductor substrate of a first conductivity type having an active region isolated by the two parallel shallow-trench-isolation (STI) regions, wherein each of two parallel STI regions is filled with a first raised field-oxide layer. A cell region can be divided into three regions: a common-source region, a gate region, and a common-drain region, wherein the gate region is located between the common-source region and the common-drain region. The common-source region comprises a first sidewall dielectric spacer being formed over a sidewall of the gate region and on a portion of a first flat bed being formed by a common-source diffusion region of a second conductivity type in the active region and two etched first raised field-oxide layers in the two parallel STI regions. The common-drain region comprises a second sidewall dielectric spacer being formed over another sidewall of the gate region and on a portion of a second flat bed being alternately formed by a common-drain diffusion region of the second conductivity type in the active region and two etched second raised field-oxide layers in the two parallel STI regions. The gate region comprises a planarized control/select-gate conductive layer having a portion formed at least on a second gate-dielectric layer in a select-gate region and another portion formed at least on a single-side tip-shaped floating-gate structure being formed on a first gate-dielectric layer in a stack-gate region; a bird-beak shaped oxide layer being formed over the single-side tip-shaped floating-gate structure to act as a first intergate-dielectric layer in the stack-gate region or the bird-beak shaped oxide layer being removed and replaced by a dielectric layer as the first intergate-dielectric layer; and a second intergate-dielectric layer being formed over an inner sidewall between the single-side tip-shaped floating-gate structure and the planarized control/select-gate conductive layer.

The self-aligned split-gate flash memory cell of the present invention as described is used to implement two contactless array architectures: a NOR-type flash memory array and a parallel common-source/drain conducive bit-lines flash memory array. The contactless NOR-type flash memory array comprises a plurality of common-source conductive bus lines being formed alternately in a first direction; a plurality of common-drain conductive islands being at least formed over the plurality of active regions along each of the common-drain regions between the plurality of common-source conductive bus lines; a plurality of self-aligned split-gate flash memory cells being formed between each of the plurality of common-source conductive bus lines and its nearby common-drain conductive islands with the elongated planarized control/select-gate conductive layer being acted as a word line in the first direction; and a plurality of bit-lines integrated with the plurality of common-drain conductive islands being simultaneously patterned and etched in a second direction being perpendicular to the first direction.

The contactless parallel common-source/drain conductive bit-lines flash memory array of the present invention comprises a plurality of common-source conductive bit lines and a plurality of common-drain conductive bit lines being formed alternately in a first direction; a plurality of self-aligned split-gate flash memory cells being formed between each of the plurality of common-source conductive bit lines and each of the plurality of common-drain conductive bit lines; and a plurality of word lines integrated with a plurality of planarized control/select-gate conductive islands being simultaneously patterned and etched in a second direction being perpendicular to the first direction.

BRIEF DESCRIPTION OF THE DRAWINGS

FIG. 1A, 1B show the schematic diagrams of the prior art, in which FIG. 1A shows a cross-sectional view of a split-gate flash memory cell with a tip-cathode structure for erasing; FIG. 1B shows a cross-sectional view of a split-gate flash memory cell with a source-side erase structure.

FIG. 2A($b$) shows a cross-sectional view of a pair of self-aligned flash memory cells in a contactless parallel common-source/drain conductive bit-lines flash memory array; FIG. 2B($b$) shows a top plan view of a contactless parallel common-source/drain conductive bit-lines self-aligned split-gate flash memory array ; FIG. 2C($b$) shows a schematic circuit diagram of a contactless parallel common-source/drain conductive bit-lines self-aligned split-gate flash memory array.

DETAILED DESCRIPTION OF THE PREFERRED EMBODIMENTS

Figure 1A:
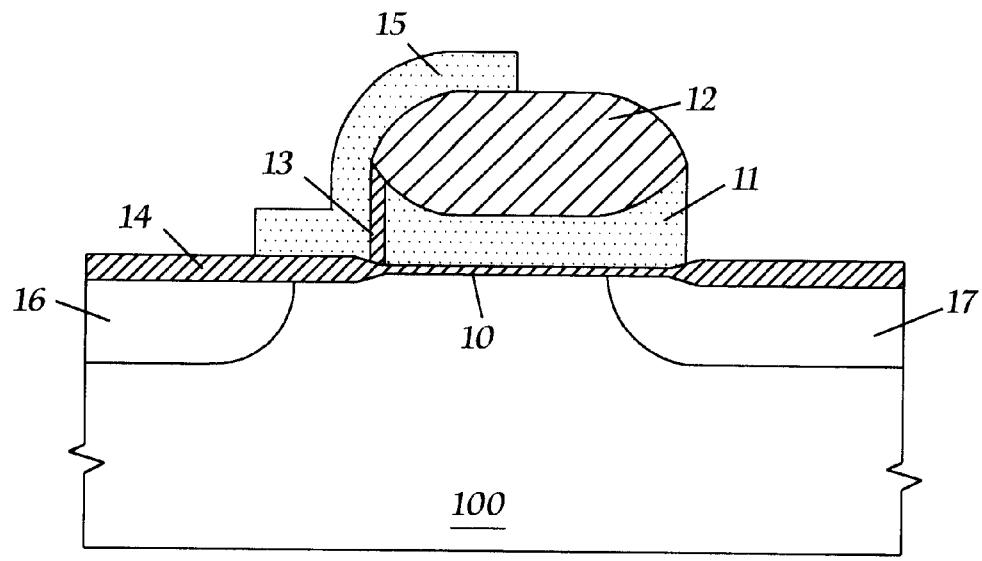
Figure 1B:
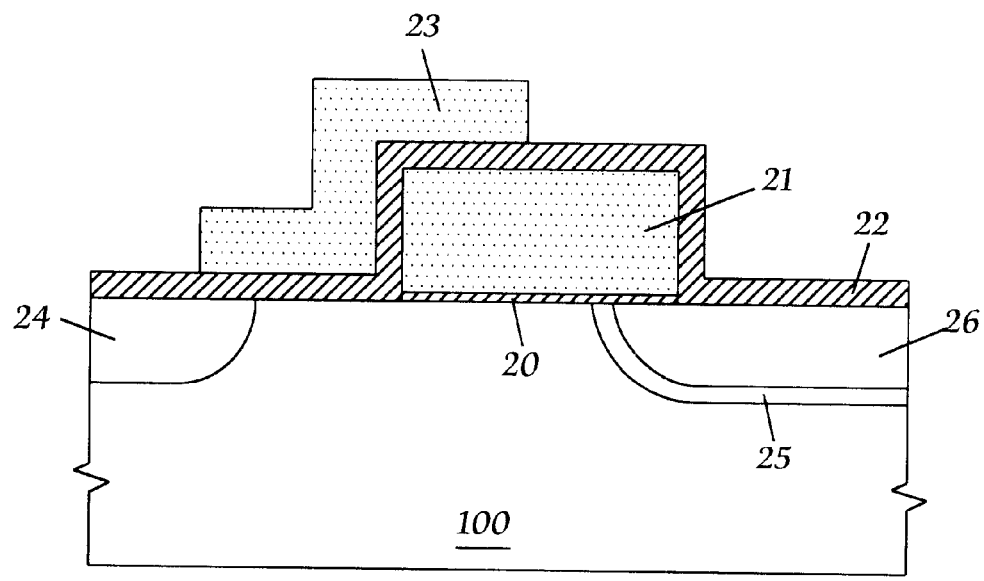
Figure 2A:
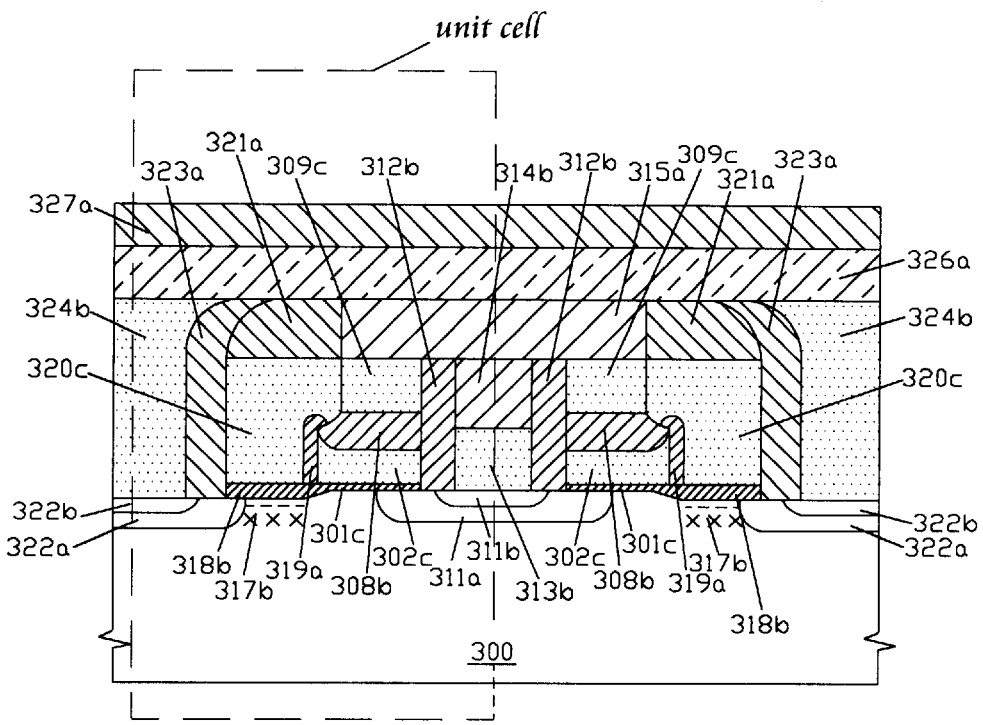
FIG. 2A($a$) through FIG. 2C($b$) show the schematic diagrams of the present invention, in which FIG. 2A($a$) shows a cross-sectional view of a pair of self-aligned split-gate flash memory cells in a contactless NOR-type flash memory array.
Figure 2A:
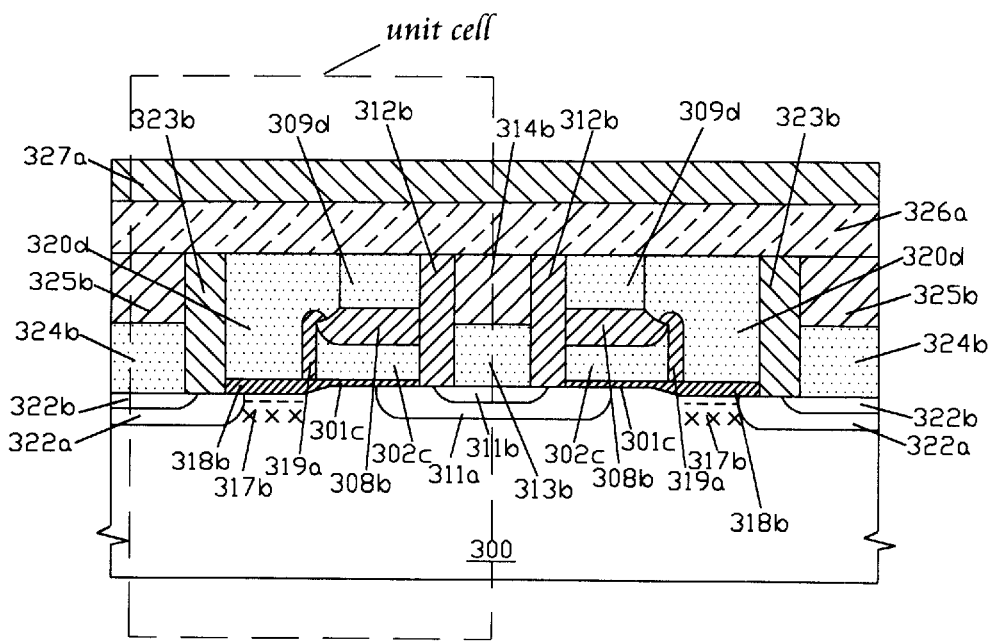
Figure 2B:
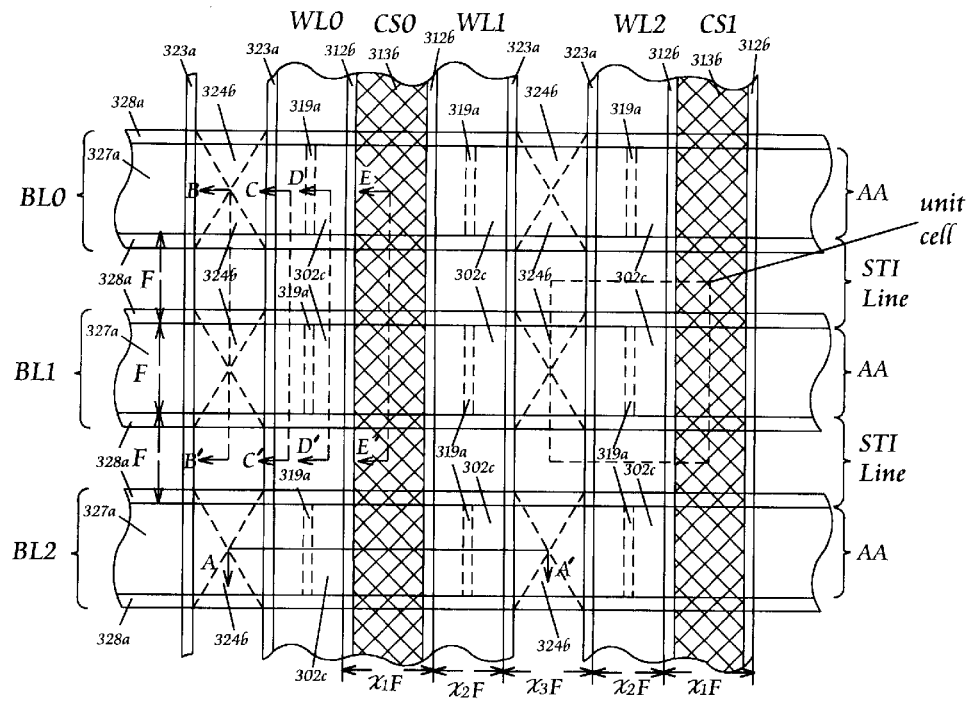
FIG. 2B($a$) shows a top plan view of a contactless NOR-type self-aligned split-gate flash memory array.
Figure 2B:
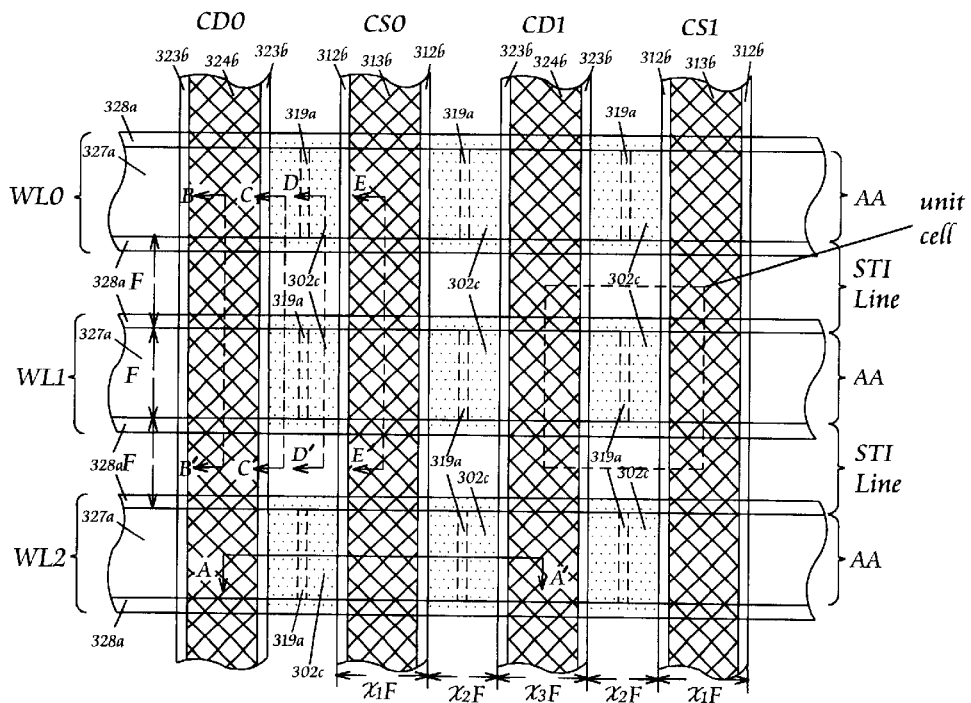

Referring now to FIG. 2A($a$) and FIG. 2A($b$), there are shown the cross-sectional views of a pair of self-aligned split-gate flash memory cells of the present invention being configured into two array architectures shown in FIG. 2B($a$) and FIG. 2B($b$), respectively, in which FIG. 2A($a$) shows a cross-sectional view along the A–A' line for a contactless NOR-type flash memory array shown in FIG. 2B($a$) and FIG. 2A($b$) shows a cross-sectional view along the A–A' line for a parallel common-source/drain conductive bit-lines flash memory array shown in FIG. 2B($b$). From FIG. 2A($a$) and FIG. 2A($b$), the gate region and the common-source region are the same for both figures and are formed on a semiconductor substrate 300 of a first conductivity type. The common-source region comprises a pair of first sidewall dielectric spacers 312*b* being formed over each sidewall of the nearby gate regions and on a portion of a first flat bed being formed alternately by an etched first raised field-oxide layer 304*c* and a shallow heavily-doped source diffusion region 311*b* of a second conductivity type formed within a common-source diffusion region 311*a*; a common-source conductive bus line 313*b* being formed over the first flat bed between the pair of first sidewall dielectric spacers 312*b*; and a first planarized thick-oxide layer 314*b* being formed over the common-source conductive bus line 313*b*. The gate region comprises an elongated planarized control/select-gate conductive layer 309*c*, 320*c* for FIG. 2A($a$) and a planarized control/select-gate conductive island 309*d*,320*d* for FIG. 2A($b$) having a portion formed at least on a second gate-dielectric layer 318*b* in a select-gate region and another portion formed at least over the first intergate-dielectric layer 308*b* and the second intergate-dielectric layer 319*a*, wherein the first intergate-dielectric layer 308*b* being formed by the local-oxidation of silicon (LOCOS) is formed over a single-side tip-shaped floating-gate structure 302*c*; a second intergate-dielectric layer 319*a* is formed over an inner sidewall of the single-side tip-shaped floating-gate structure 302*c*; the single-side tip-shaped floating-gate structure 302*c* is formed over a first gate-dielectric layer 301*c*; and an implanted region 317*b* of a first conductivity type having a shallow implant region as indicated by the dash line for threshold-voltage adjustment and a deep implant region as indicated by the cross symbols for forming a punch-through stop is formed under the second gate-dielectric layer 318*b*.

For the common-drain region shown in FIG. 2A($a$), a second sidewall dielectric spacer 323*a* is formed over a sidewall of the gate region and on a portion of a second flat bed being alternately formed by an etched second raised field-oxide layer 304*e* and a shallow heavily-doped drain diffusion region 322*b* of a second conductivity type formed within a common-drain diffusion region 322*a*; and a planarized common-drain conductive island 324b is formed over the second flat bed outside of the second sidewall dielectric spacer 323a. As shown in FIG. 2A(a), a fourth sidewall dielectric spacer 321a is formed over a portion 320c of the elongated planarized control/select-gate conductive layer 309c,320c; a planarized dielectric layer 315a is formed over another portion 309c of the planarized control/select-gate conductive layer and on the pair of first sidewall dielectric spacers 312b and the first planarized thick-oxide layer 314b in the common-source region; and a first interconnect-metal layer 326a integrated with the planarized common-drain conductive islands 324b are simultaneously patterned and etched by a hard masking layer including a masking dielectric layer 327a and its two sidewall dielectric spacers 328a to form a bit line transversely to the common-source conductive bus line 313b.

For the common-drain region shown in FIG. 2A(b), a second sidewall dielectric spacer 323b is formed over a sidewall of the gate region and on a portion of a second flat bed alternately formed by an etched second raised field-oxide layer 304e and a shallow heavily-doped drain diffusion region 322b of a second conductivity type formed within a common-drain diffusion region 322a; a common-drain conductive bus line 324b is formed over the second flat bed outside of the second sidewall dielectric spacer 323b; and a second planarized thick-oxide layer 325b is formed over the common-drain conductive bus line 324b. As shown in FIG. 2A(b), a first interconnect-metal layer 326a integrated with the planarized control/select-gate conductive islands 309d, 320d are simultaneously patterned and etched by a hard masking layer including a masking dielectric layer 327a and its two sidewall dielectric spacers 328a to form a word line transversely to the common-source/drain conductive bus lines 313b, 324b.

Figure 2C:
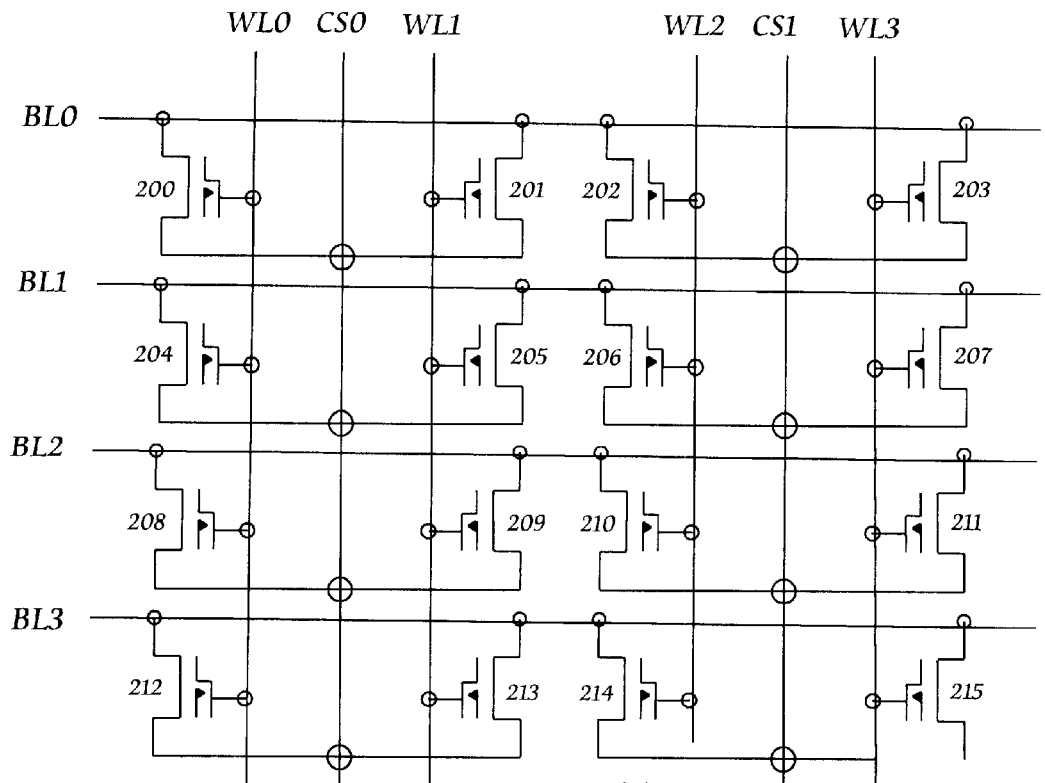
FIG. 2C($a$) shows a schematic circuit diagram of a NOR-type self-aligned split-gate flash memory array.
Figure 2C:
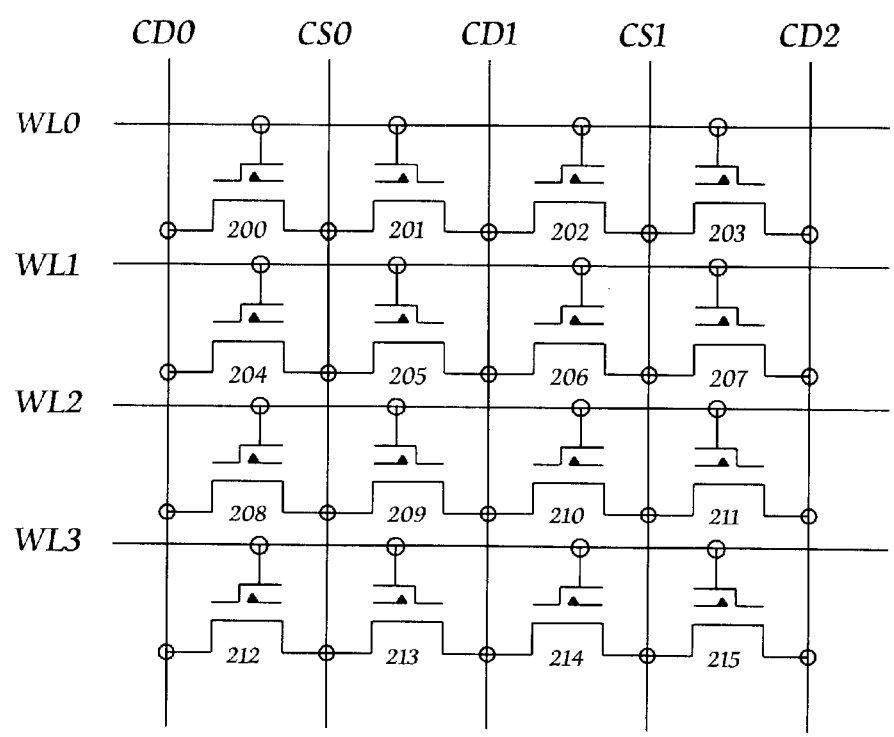

FIG. 2B(a) shows a top plan view of a contactless NOR-type flash memory array of the present invention, in which the cross-sectional view along the A–A' line is shown in FIG. 2A(a). As shown in FIG. 2B(a), a plurality of active regions (AA's) and a plurality of parallel STI regions (STI lines) are formed alternately on a semiconductor substrate 300 of a first conductivity type, wherein a first raised field-oxide layer 304b is formed in each of the plurality of parallel STI regions; a plurality of common-source conductive bus lines 313b (CS0,CS1) are formed alternately and transversely to the plurality of parallel STI regions, wherein each of the plurality of common-source conductive bus lines is formed over a first flat bed between a pair of first sidewall dielectric spacers 312b and the first flat bed is formed alternately by an etched first raised field-oxide layer 304c and a shallow heavily-doped source diffusion region 311b of a second conductivity type formed within a common-source diffusion region 311a; a plurality of planarized common-drain conductive islands 324b are formed alternately between the plurality of common-source conductive bus lines and over the second flat beds between the pair of second sidewall dielectric spacers 323a, wherein each of the second flat beds is alternately formed by an etched second raised field-oxide layer 304e and a shallow heavily-doped drain diffusion region 322b of a second conductivity type formed within a common-drain diffusion region 322a; a plurality of self-aligned split-gate flash memory cells are located between each of the plurality of common-source conductive bus lines 313b and the plurality of planarized common-drain conductive islands 324b; a plurality of bit lines 326a (BL0–BL2) integrated with the plurality of common-drain conductive islands 324b are simultaneously patterned and etched to be perpendicular to the plurality of common-source conductive bus lines 313b by using a plurality of hard masking layers, wherein each of the plurality of hard masking layers includes a masking dielectric layer 327a being aligned above the active region (AA) and two sidewall dielectric spacers 328a being formed over each sidewall of the masking dielectric layer 327a. The various cross-sectional views as indicated by the B–B' line, the C–C' line, the D–D' line, and the E–E' line as shown in FIG. 2B(a) are shown in FIG. 5A through FIG. 5D, respectively. The schematic circuit diagram of FIG. 2B(a) is shown in FIG. 2C(a).

FIG. 2B(b) shows a contactless parallel common-source/drain conductive bit-lines array of the present invention, in which a plurality of active regions (AA's) and a plurality of parallel STI regions (STI lines) are alternately formed over a semiconductor substrate 300 of a first conductivity type with each of the plurality of parallel STI regions being filled with a first raised field-oxide layer 304b; a plurality of common-source conductive bus lines 313b (CS0, CS1) and a plurality of common-drain conductive bus lines 324b (CD0, CD1) are formed alternately and transversely to the plurality of parallel STI regions; a plurality of self-aligned split-gate flash memory cells are formed between each of the plurality of common-source conductive bus lines 313b and its nearby common-drain conductive bus lines 324b; and a plurality of word lines (WL0–WL2) integrated with a plurality of planarized control/select-gate conductive islands are simultaneously patterned and etched to be perpendicular to the plurality of common-source/drain conductive bus lines 313b, 324b by using a plurality of hard masking layers with each of the plurality of hard masking layers comprising a masking dielectric layer 327a being aligned above the active region and two sidewall dielectric spacers 328a being formed over each sidewall of the masking dielectric layer 327a. Similarly, each of the plurality of common-source conductive bus lines 313b is formed over a first flat bed between the pair of first sidewall dielectric spacers 312b and the first flat bed is alternately formed by an etched first raised field-oxide layer 304c and a shallow heavily-doped source diffusion region 311b of a second conductivity type formed within a common-source diffusion region 311a; each of the plurality of common-drain conductive bus lines 324b is formed over a second flat bed between a pair of second sidewall dielectric spacers 323b and the second flat bed is alternately formed by an etched second raised field-oxide layer 304e and a shallow heavily-doped drain diffusion region 322b of a second conductivity type formed within a common-drain diffusion region 322a. The various cross-sectional views as indicated by the B–B' line, the C–C' line, the D–D' line, and the E–E' line shown in FIG. 2B(b) are shown in FIG. 6A through FIG. 6D, respectively. The schematic circuit diagram of FIG. 2B(b) is shown in FIG. 2C(b).

From FIG. 2B(a) and FIG. 2B(b), the width and the space of a shallow-trench-isolation (STI) region can be defined to be a minimum-feature-size(F) of technology used; a common-source region and a common-drain region can be defined to be $X_1F$ and $X_3F$, respectively; and a control/select-gate region of a self-aligned split-gate flash memory cell can be defined to be $X_2F$. It is clearly seen that $X_1$, $X_2$ and $X_3$ are the scaling factors and can be defined to be equal to unity, then the cell size as marked by a dash square in FIG. 2B(a) and FIG. 2B(b) is equal to $4F^2$. Therefore, the cell size of the present invention can be fabricated to be smaller than $4F^2$ by controlling the scaling factors $X_1$, $X_2$ or $X_3$. It should be emphasized that the self-aligned split-gate flash memory cell of the present invention can be erased by the tip cathode formed by the single-side tip-shaped floating-gate structure with a higher field-emission efficiency due to a higher coupling ratio of the self-aligned structure used in the present invention. Similarly, the self-aligned split-gate flash memory cell can be erased by tunneling the stored electrons from the floating-gate layer to the common-source diffusion region if the tip-cathode is covered by a thicker second intergate-dielectric layer.

Accordingly, the major advantages and features of the present invention are summarized below:

(a) The self-aligned split-gate flash memory cell of the present invention can be made to have a cell size smaller than $4F^2$.

(b) The self-aligned split-gate flash memory cell of the present invention can be erased with a higher field-emission efficiency through the single-side tip-shaped floating-gate structure.

(c) The two contactless flash memory arrays of the present invention offer a highly common-source conductive bus line over the common-source diffusion regions with smaller bus-line resistance and smaller bus-line capacitance with respect to the semiconductor substrate as compared to those of the buried diffusion layer of the prior art.

(d) The contactless NOR-type flash memory array of the present invention offers a highly conductive bit line being integrated with common-drain conductive islands.

(e) The contactless parallel common-source/drain conductive bit-lines flash memory array of the present invention offers a highly conductive layer for both common-source conductive bus line and common-drain conductive bus line with smaller bus-line resistance and smaller bus-line capacitance with respect to the semiconductor substrate.

(f) The contactless parallel common-source/drain conductive bit-lines flash memory array of the present invention offers a highly conductive word line being integrated with planarized control/select-gate conductive islands.

Figure 3A:
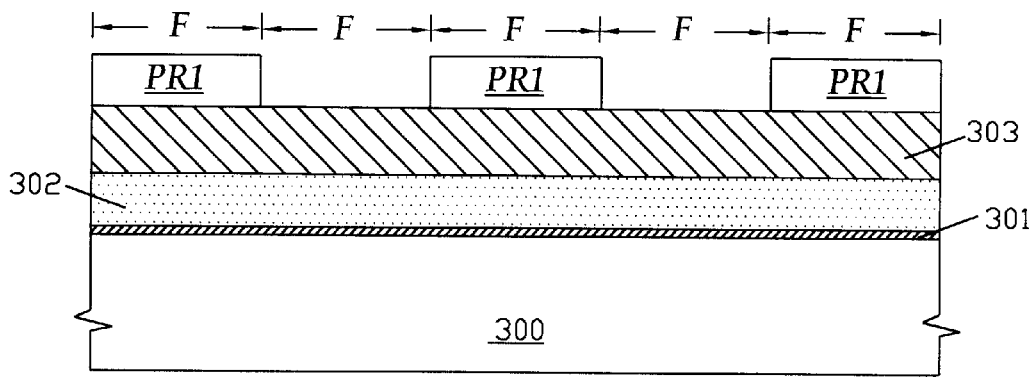
FIG. 3A through FIG. 3F show the process steps and their cross-sectional views of forming a shallow-trench-isolation structure for a self-aligned split-gate flash memory cell and its contactless flash memory array of the present invention.

Referring now to FIG. 3A through FIG. 3F, there are shown the process steps and their cross-sectional views of fabricating a shallow-trench-isolation (STI) structure for a self-aligned split-gate flash memory cell having a single-side tip-shaped floating-gate structure and its contactless flash memory arrays. FIG. 3A shows that a first gate-dielectric layer 301 is formed on a semiconductor substrate 300 of a first conductivity type; a first conductive layer 302 is formed on the first gate-dielectric layer 301; a first masking dielectric layer 303 is formed on the first conductive layer 302; and a plurality of masking photoresist PR1 are formed over the first masking dielectric layer 303 to define a plurality of active regions (AA's) (under PR1) and a plurality of parallel shallow-trench-isolation regions (STI lines) (between PR1). The first gate-dielectric layer 301 is preferably a thermal-oxide layer or a nitrided thermal-oxide layer having a thickness between 80 Angstroms and 120 Angstroms. The first conductive layer 302 is preferably made of doped polycrystalline-silicon or doped amorphous-silicon as deposited by low-pressure chemical-vapor-deposition (LPCVD) and its thickness is preferably between 1000 Angstroms and 3000 Angstroms. The first masking dielectric layer 303 is preferably made of silicon-nitrides as deposited by LPCVD and its thickness is preferably between 500 Angstroms and 3000 Angstroms. It should be noted that the width and the space of each masking photoresist PR1 can be defined to be a minimum-feature-size (F) of technology used, as indicated in FIG. 3A.

Figure 3B:
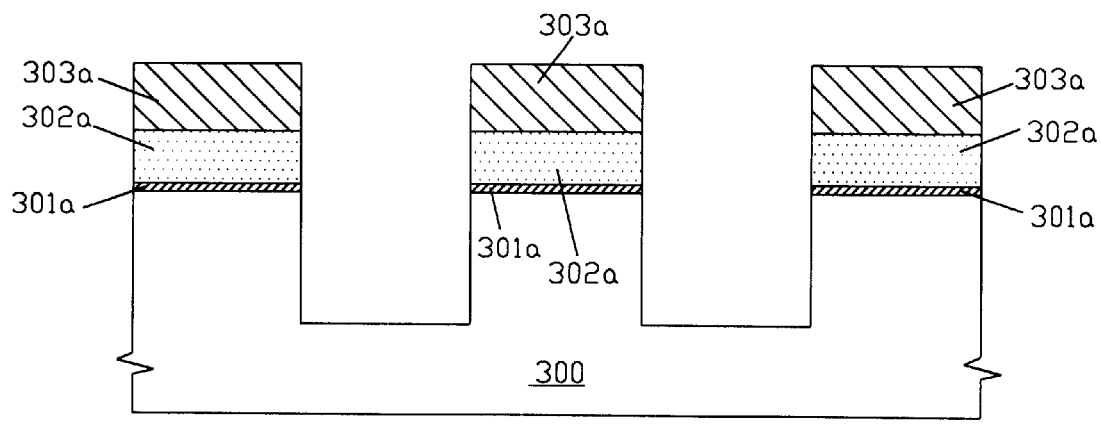

FIG. 3B shows that the first masking dielectric layer 303, the first conductive layer 302, and the first gate-dielectric layer 301 outside of the plurality of masking photoresist PR1 are sequentially removed and the semiconductor substrate 300 is then anisotropically etched to form shallow trenches; and subsequently, the plurality of masking photoresist PR1 are stripped. The depth of shallow trenches in the semiconductor substrate 300 is preferably between 3000 Angstroms and 8000 Angstroms.

Figure 3C:
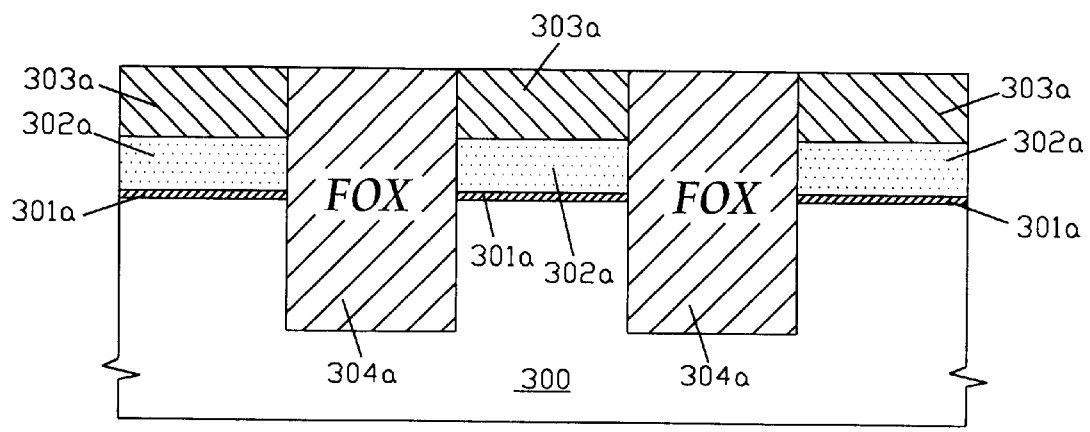

FIG. 3C shows that the planarized field-oxide layers 304a are formed to fill up the gaps as shown in FIG. 3B. The planarized field-oxide layer 304a is preferably made of silicon-oxides, phosphosilicate glass (PSG), or Borophosphosilicate glass (BPSG), as deposited by high-density plasma (HDP) CVD or CVD and is formed by first depositing a thick silicon-oxide film 304 to fill up the gaps and then planarizing the deposited thick silicon-oxide film 304 using chemical-mechanical polishing (CMP) with the first masking dielectric layer 303a as a polishing stop.

Figure 3D:
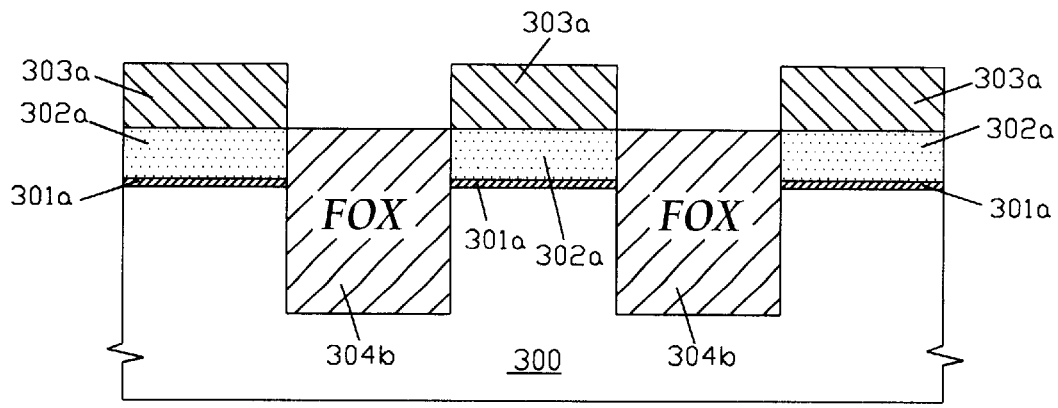

FIG. 3D shows that the planarized field-oxide layers 304a are etched back to a depth equal to a thickness of the first masking dielectric layer 303a to form the first raised field-oxide layers 304b.

Figure 3E:
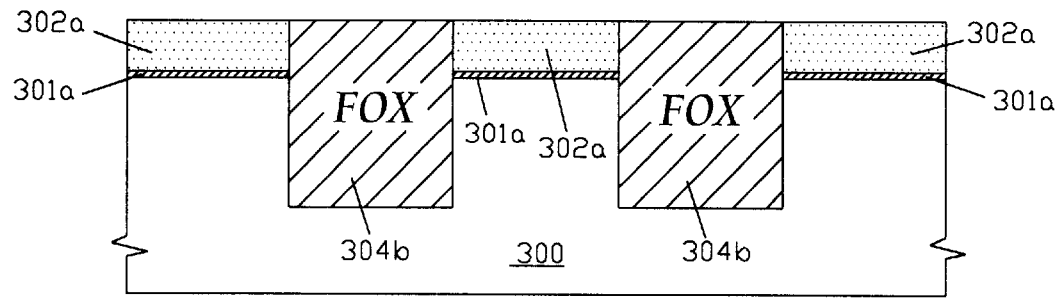

FIG. 3E shows that the first masking dielectric layers 303a are removed by hot-phosphoric acid or anisotropic dry etching to form a flat surface being formed alternately by the first raised field-oxide layer 304b and the first conductive layer 302a. The flat surface is favorable for fine-line lithography later on.

Figure 3F:
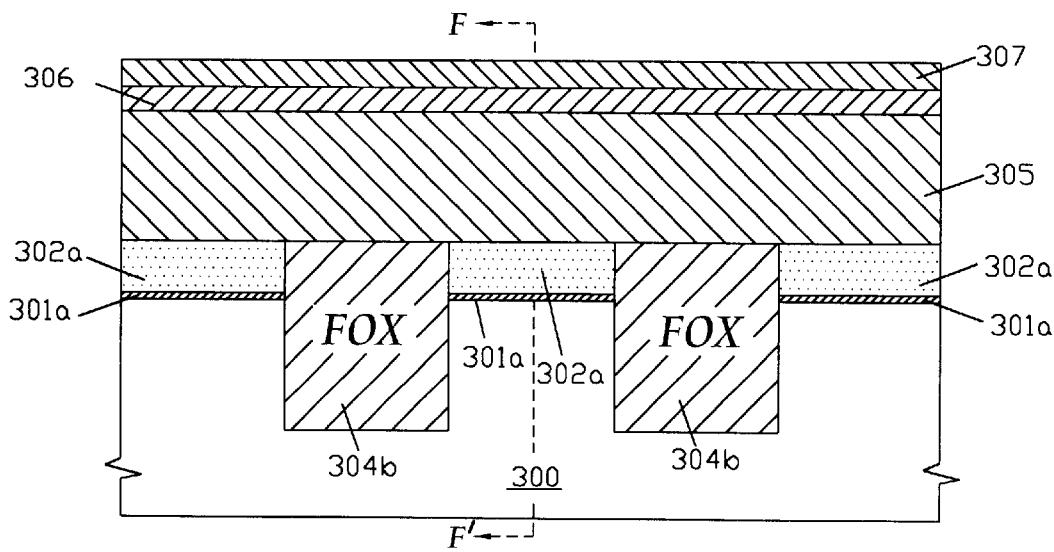
Figure 4A:
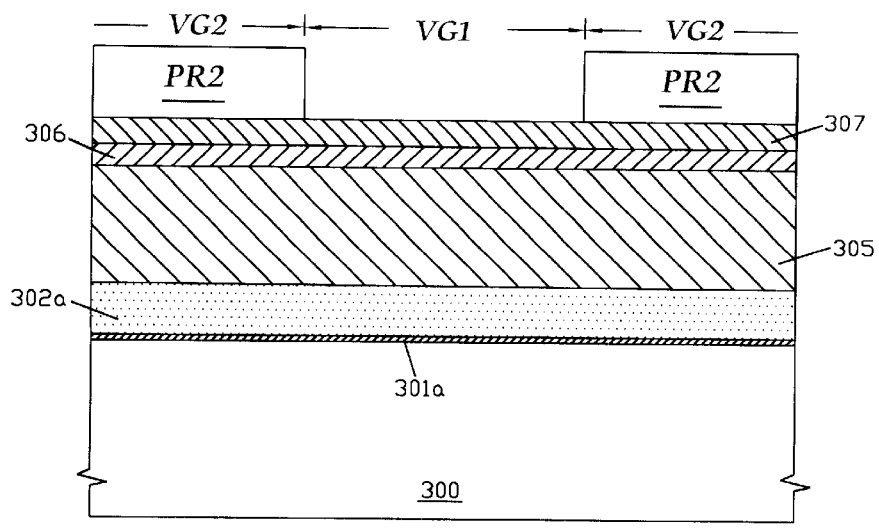
FIG. 4A through FIG. 4M($b$) show the process steps and their cross-sectional views of forming a self-aligned split-gate flash memory cell and its contactless flash memory array of the present invention.

FIG. 3F shows that a second masking dielectric layer 305 is formed over the flat surface shown in FIG. 3E; a third masking dielectric layer 306 is then formed over the second masking dielectric layer 305; and a fourth masking dielectric layer 307 is subsequently formed over the third masking dielectric layer 306. The second masking dielectric layer 305 is preferably made of silicon-nitrides as deposited by LPCVD and its thickness is preferably between 4000 Angstroms and 12000 Angstroms. The third masking dielectric layer 306 is preferably made of silicon-oxides as deposited by LPCVD and its thickness is preferably between 300 Angstroms and 1000 Angstroms. The fourth masking dielectric layer 307 is preferably made of silicon-nitrides as deposited by LPCVD and its thickness is preferably between 300 Angstroms and 1000 Angstroms. The cross-sectional view of an active region as marked by the F–F' line in FIG. 3F is shown in FIG. 4A.

Referring now to FIG. 4A through FIG. 4M, there are shown the process steps and their cross-sectional views of fabricating a self-aligned split-gate flash memory cell having a single-side tip-shaped floating-gate structure and its contactless flash memory arrays. FIG. 4A shows a small portion of a memory array, in which a plurality of masking photoresist PR2 are formed over the fourth masking dielectric layer 307 to define a plurality of first virtual-gate regions VG1 (between PR2) and a plurality of second virtual-gate regions VG2 (under PR2). Each of the plurality of first virtual-gate regions VG1 includes a common-source region and a pair of first control-gate regions. Each of the plurality of second virtual-gate regions VG2 includes a common-drain region and a pair of second control-gate regions. It should be noted that both the first virtual-gate region VG1 and the second virtual-gate region VG2 are scalable.

Figure 4B:
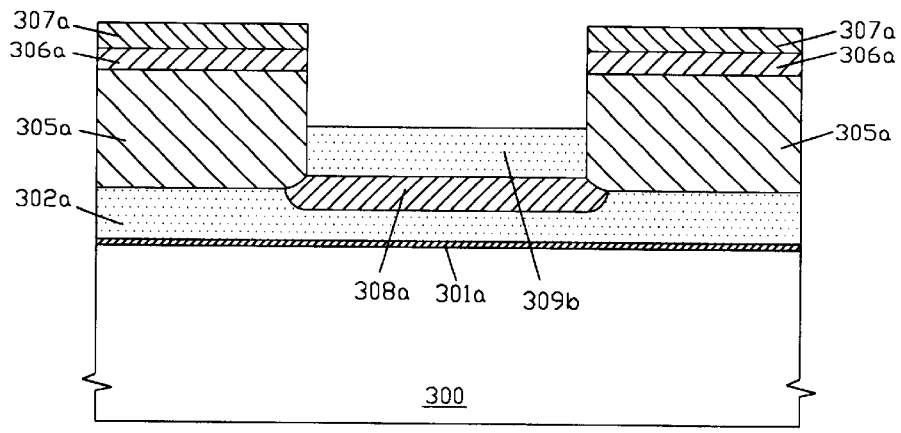

FIG. 4B shows that the fourth masking dielectric layer 307, the third masking dielectric layer 306 and the second masking dielectric layer 305 outside of the plurality of masking photoresist PR2 are sequentially removed and then the plurality of masking photoresist PR2 are stripped; and a well-known local oxidation of silicon (LOCOS) process is performed to oxidize the exposed first conductive layer 302a to form the bird's beaks under each of the second masking dielectric layers 305a; and subsequently, a planarized second conductive layer 309a is formed over the first poly-oxide layer 308a in each of the plurality of first virtual-gate regions VG1 and is then etched back to form an etched-back second conductive layer 309b. The planarized second conductive layer 309a is preferably made of doped polycrystalline-silicon as deposited by LPCVD and is formed by first depositing a thick second conductive layer 309 to fill up the gaps and then planarizing the deposited thick second conductive layer 309 using CMP with the fourth masking dielectric layer 307a as a polishing stop. It should be noted that a metal-silicide layer can be formed over 309b by using either a self-aligned silicidation process or a deposition technique as described for an etched-back second conductive layer 309b and is preferably a tungsten-silicide (WSi$_2$) layer. The etched-back second conductive layer 309b can be a metal layer such as a tungsten (W) layer. It should be emphasized that the first poly-oxide layer 308a can be removed by dipping in a buffered hydrofluoric-acid solution and a thermal poly-oxide or nitrided thermal poly-oxide layer or an oxide-nitride- oxide (ONO) structure is formed. Similarly, the LOCOS process can be replaced by an isotropic etching process using either dry or wet etching and a new dielectric layer as described is then formed over the single-side tip-shaped floating-gate structure.

Figure 4C:
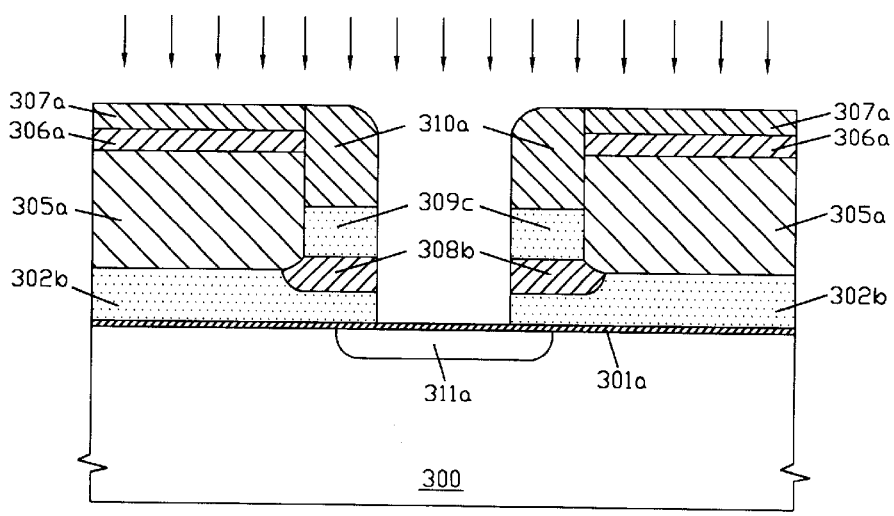

FIG. 4C shows that a third sidewall dielectric spacer 310a is formed over each sidewall in each of the plurality of first virtual-gate regions VG1 shown in FIG. 4B and on the etched-back second conductive layer 309b; the etched-back second conductive layer 309b and the first poly-oxide layer 308a outside of the third sidewall dielectric spacers 310a are sequentially removed and the first raised field-oxide layers 304b are then etched back to a level equal to the top surface of the first gate-dielectric layer 301a, and subsequently, the first conductive layers 302b are removed in a self-aligned manner; and an ion-implantation is performed in a self-aligned manner to form a plurality of common-source diffusion regions 311a of a second conductivity type in the semiconductor substrate 300 of the active regions along each of the plurality of first virtual-gate regions VG1. The common-source diffusion region 311a can be lightly doped, moderately doped, or heavily doped.

Figure 4D:
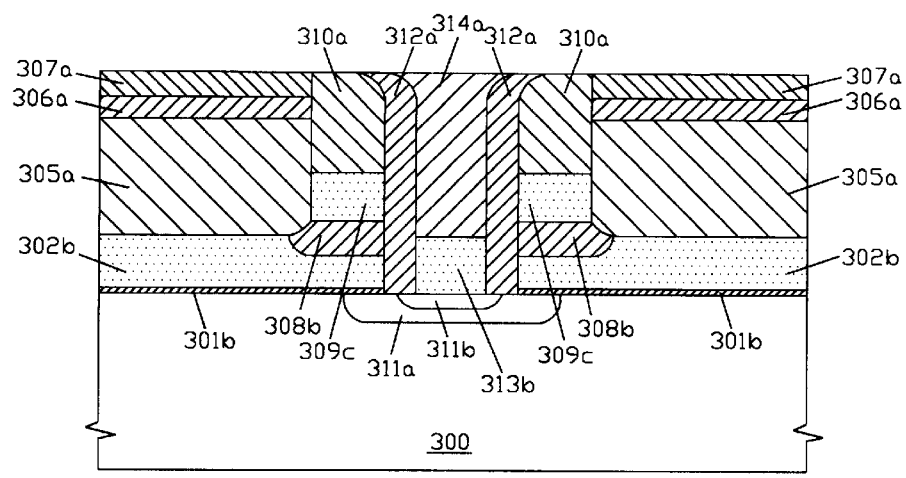

FIG. 4D shows that the first gate-dielectric layers 301a in each of the active regions are removed by using a dilute hydrofluoric acid or an anisotropic dry etching and the etched raised field-oxide layer in each of parallel STI regions is simultaneously etched to form a first flat bed along each of the plurality of common-source regions. The first flat bed is formed alternately by a common-source diffusion region 311a and an etched first raised field-oxide layer 304c. FIG. 4D shows that a pair of first sidewall dielectric spacers 312a are formed over each sidewall of the common-source region and on a portion of the first flat bed; a common-source conductive layer 313b is formed over the first flat bed between the pair of first sidewall dielectric spacers 312a in each of the common-source regions; and a first planarized thick-oxide layer 314a is formed over the common-source conductive layer 313b and the pair of first sidewall dielectric spacers 312a. The first sidewall dielectric spacer 312a is preferably made of silicon-nitrides or silicon-oxides as deposited by LPCVD. The common-source conductive layer 313b is preferably made of doped polycrystalline-silicon as deposited by LPCVD and is formed by first depositing a thick third conductive layer 313 over the gaps between the pair of first sidewall dielectric spacers 312a and then planarizing the deposited thick third conductive layer 313 using CMP with the fourth masking dielectric layer 307a as a polishing stop and subsequently etching back the planarized third conductive layer 313a. The common-source conductive layer 313b can be a composite conductive layer having a tungsten-silicide (WSi$_2$) layer formed over a doped polycrystalline-silicon layer, in which the tungsten-silicide layer is formed by a well-known self-aligned silicidation process or a deposition technique similar to that of the common-source conductive layer 313b being made of doped polycrystalline-silicon. It should be noted that the doped polycrystalline-silicon layer 313b can be further implanted with a high-dose of doping impurities to act as a dopant diffusion for forming a shallow heavily-doped diffusion region 311b within each of the common-source diffusion regions 311a. It should be emphasized that the common-source conductive layer 313b can be a metal layer over a barrier-metal layer over a silicided doped polycrystalline-silicon layer. The first planarized thick-oxide layer 314a is preferably made of silicon-oxides, phosphosilicate-glass (P-glass) or boro-phosphosilicate glass (BP-glass), as deposited by high-density plasma (HDP) CVD or CVD. Similarly, the first planarized thick-oxide layer 314a is formed by first depositing a thick-oxide film 314 over the formed structure and then planarizing the deposited thick-oxide film 314 using CMP with the fourth masking dielectric layer 307a as a polishing stop.

Figure 4E:
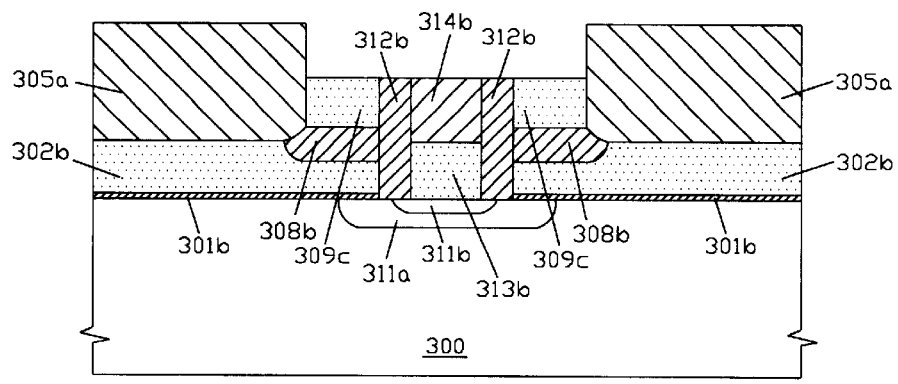

FIG. 4E shows that the third sidewall dielectric spacers 310a, the first sidewall dielectric spacers 312a, and the planarized thick-oxide layer 314a above the top level of the second conductive layer 309c in each of first virtual-gate regions are sequentially etched back, and the fourth masking dielectric layers 307a and the third masking dielectric layers 306a in each of the second virtual-gate regions are simultaneously removed.

Figure 4F:
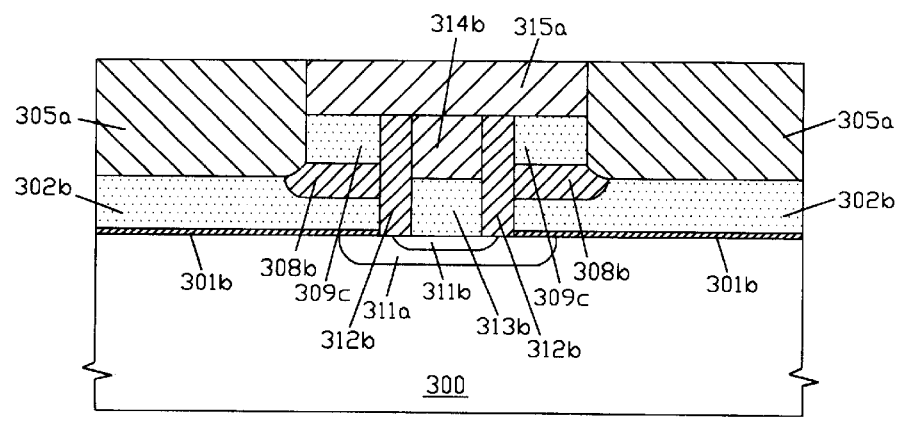

FIG. 4F shows that a planarized dielectric layer 315a is formed over the gap in each of the first virtual-gate regions by first depositing a thick silicon-oxide film 315 to fill up the gaps and then planarizing the deposited thick silicon-oxide film 315 using CMP with the second masking dielectric layer 305a as a polishing stop.

Figure 4G:
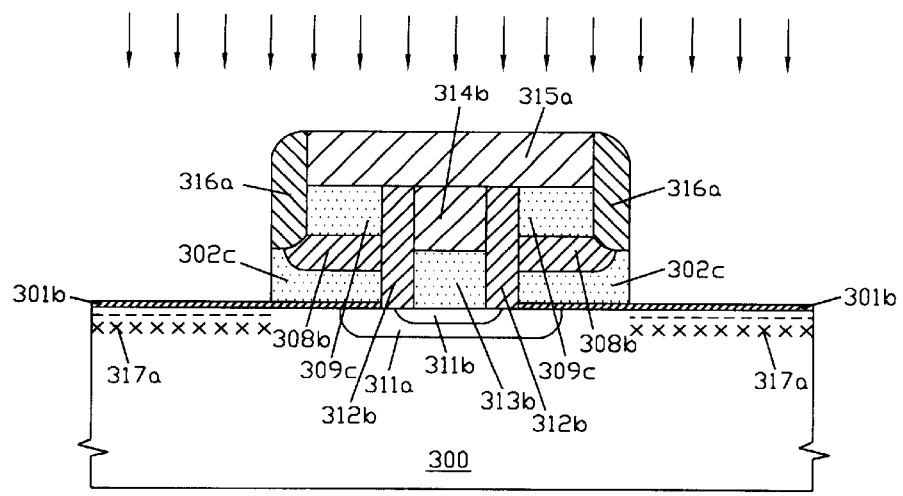

FIG. 4G shows that the second masking dielectric layers 305a in the second virtual-gate regions are removed by hot-phosphoric acid or anisotropic dry etching and a fourth sidewall dielectric spacer 316a is formed over each sidewall formed by the removed second masking dielectric layer 305a in each of the second virtual-gate regions; and subsequently, the first conductive layers 302b between the pair of fourth sidewall dielectric spacers 316a in each of the second virtual-gate regions are removed by using anisotropic dry etching. An ion-implantation is performed in a self-aligned manner to form an implanted region 317a of a first conductivity type in the semiconductor substrate 300 of the active regions, in which the implanted region 317a may include a shallow implant region as indicted by a dash line for threshold-voltage adjustment and a deep implant region as indicated by the cross symbols for forming a punch-through stop. The fourth sidewall dielectric spacer 316a is preferably made of silicon-nitrides as deposited by LPCVD and its spacer width is mainly used to create a buffer region for sidewall oxidation of the first conductive layer 302c later on. It is clearly seen that the fourth sidewall dielectric spacer 316a offers two purposes: one is to prevent the tip-cathode from damages due to anisotropic dry etching; the other is to offer a buffer region for sidewall oxidation without smearing out the sharp shape of the tip cathode. As a consequence, a reproducible tip cathode with higher field-emission probability can be easily obtained by the present invention.

Figure 4H:
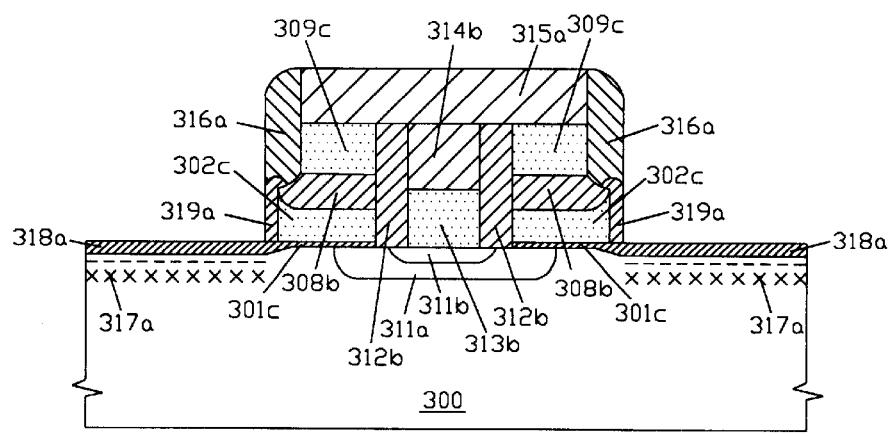

FIG. 4H shows that the first gate-dielectric layers 301b outside of the fourth sidewall dielectric spacers 316a are removed by dipping in a dilute hydrofluoric acid and a thermal oxidation process is then performed to form a second gate-dielectric layer 318a over the exposed semiconductor substrate 300 and a second poly-oxide layer 319a over each sidewall of the exposed second conductive layer 302c.

Figure 4I:
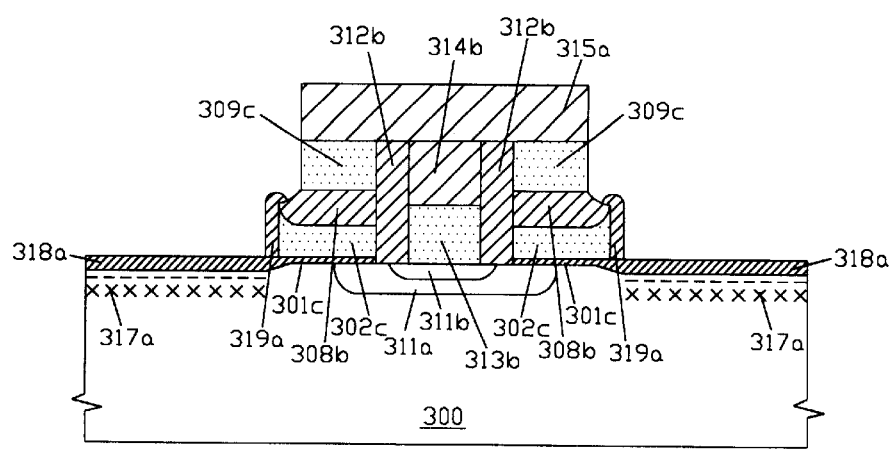

FIG. 4I shows that the fourth sidewall dielectric spacers 316a are removed by using hot-phosphoric acid. It is clearly seen that the second poly-oxide layer 319a being formed over the sidewall is thicker than on the tip cathode and a higher field-emission efficiency of the tip-cathode of the present invention is expected. Moreover, a thermal nitridation process can be performed in a $N_2O$ or $NH_3$ ambient to nitride the second poly-oxide layer 319a and the second gate-dielectric layer 318a before removing the fourth sidewall dielectric spacers 316a for increasing the endurance of the second poly-oxide layer 319a over the tip-cathode.

Figure 4J:
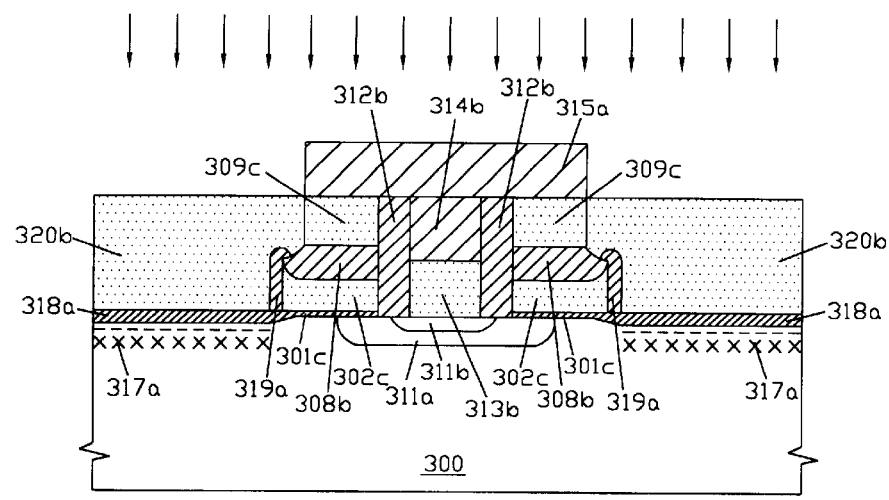

FIG. 4J shows that a fourth conductive layer 320b is formed over the gap in each of the second virtual-gate regions and is formed by first depositing a thick fourth conductive layer 320 over the formed structure and then planarizing the deposited thick fourth conductive layer 320 using CMP or etch-back; and subsequently, the planarized fourth conductive layer 320a is etched back to a thickness of the planarized dielectric layer 315a. The fourth conductive layer 320b is preferably made of doped polycrystalline-silicon and is further implanted with a high-dose of doping impurities. Similarly, the fourth conductive layer 320b can be a composite conductive layer such as a tungsten-silicide layer over a doped polycrystalline-silicon layer as described for the second conductive layer 309c.

Figure 4K:
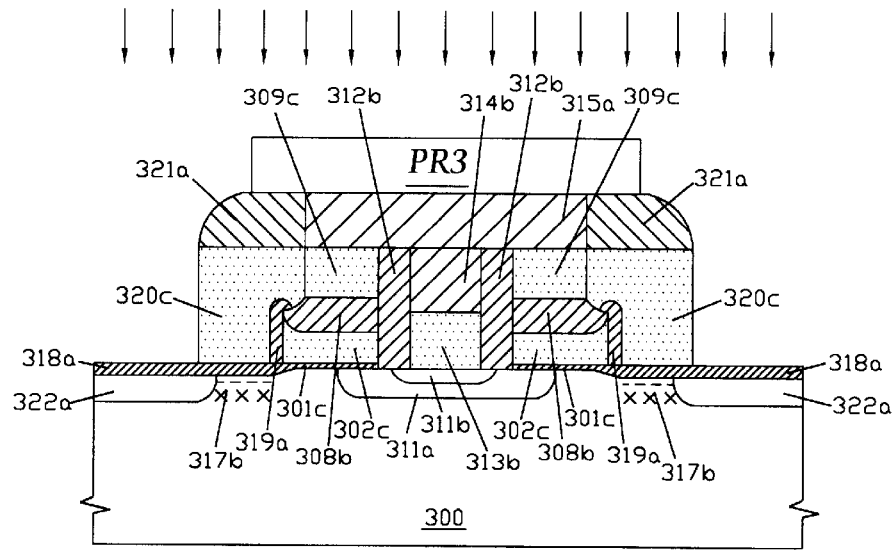

FIG. 4K shows that a fifth sidewall dielectric spacer 321a is formed over each sidewall of the planarized dielectric layer 315a in each of first virtual-gate regions; a plurality of masking photoresist PR3 are formed over the planarized dielectric layer 315a and a portion of the fifth sidewall dielectric spacers 321a to protect the planarized dielectric layer 315a from etching; the fourth conductive layer 320b is etched back first to a top surface of the first raised field-oxide layers 304b in the parallel STI regions, then the first raised field-oxide layers 304b are then ansiotropically etched back to a top surface of the second gate-dielectric layer 318a and subsequently, the remained fourth conductive layers 320b are anisotropically removed. An ion-implantation is performed in a self-aligned manner by implanting doping impurities across the second gate dielectric layer 318a into the semiconductor substrate 300 of the active regions to form the common-drain diffusion regions 322a of a second conductivity type.

Figure 4L:
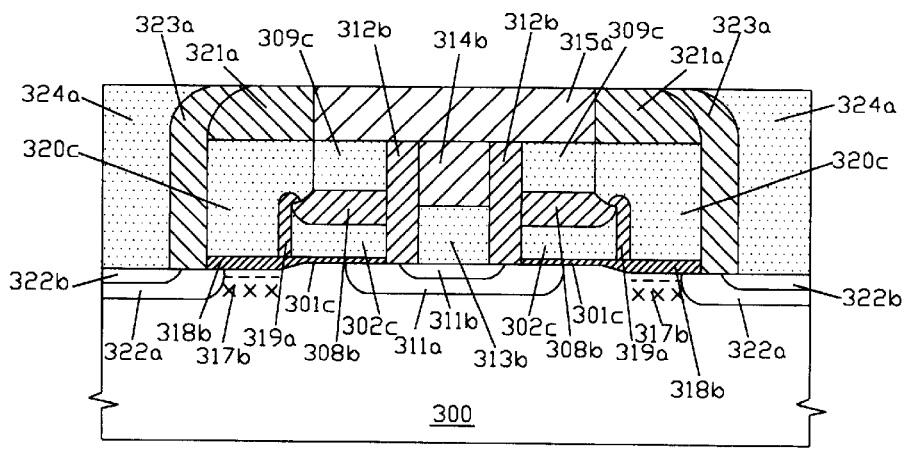
Figure 4L:
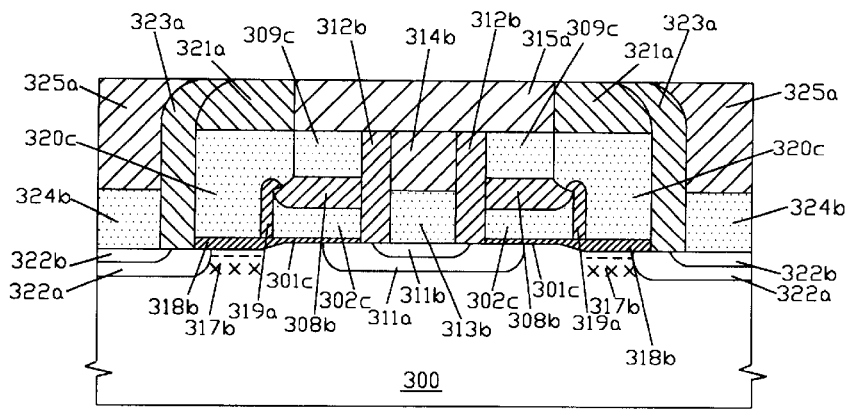

FIG. 4L(a) shows that the second gate-dielectric layers 318a outside of the fifth sidewall dielectric spacers 321a are removed by dipping in a dilute hydrofluoric-acid and the etched-back second raised field-oxide layers are further etched simultaneously to form a second flat bed in each of the common-drain regions; the plurality of masking photoresist PR3 are then stripped; a second sidewall dielectric spacer 323a is formed over each sidewall of the common-drain regions and on a portion of the second flat bed being alternately formed by the etched second raised field-oxide layer 304e and the common-drain diffusion region 322a; and subsequently, a planarized fifth conductive layer 324a is formed over the second flat bed between the pair of second sidewall dielectric spacers 323a in each of the common-drain regions. The planarized fifth conductive layer 324a is preferably a planarized doped polycrystalline-silicon layer or is formed by first depositing a thin doped polycrystalline-silicon layer and then implanting heavily with a high dose of doping impurities to act as a dopant diffusion source for forming a shallow heavily-doped drain diffusion region 322b of a second conductivity type within each of the common-drain diffusion regions 322a; a thick tungsten-silicide or tungsten film is then formed to fill up the gaps; and a planarization process is performed by using CMP or etching-back. It should be noted that a barrier-metal layer such as a titanium-nitride or tantalum-nitride layer can be formed over the thin doped polycrystalline-silicon layer before depositing a thick tungsten-silicide or tungsten film.

FIG. 4L(b) shows that a fifth conductive layer 324b is formed over the second flat bed between the pair of second sidewall dielectric spacers 323a in each of the common-drain regions and a second planarized thick-oxide layer 325a is formed over the fifth conductive layer 324b and the pair of second sidewall dielectric spacers 323a in each of the common-drain regions. Similarly, the fifth conducive layer 324b can be made by using the same process technique as discussed for the third conductive layer 313b.

Figure 4M:
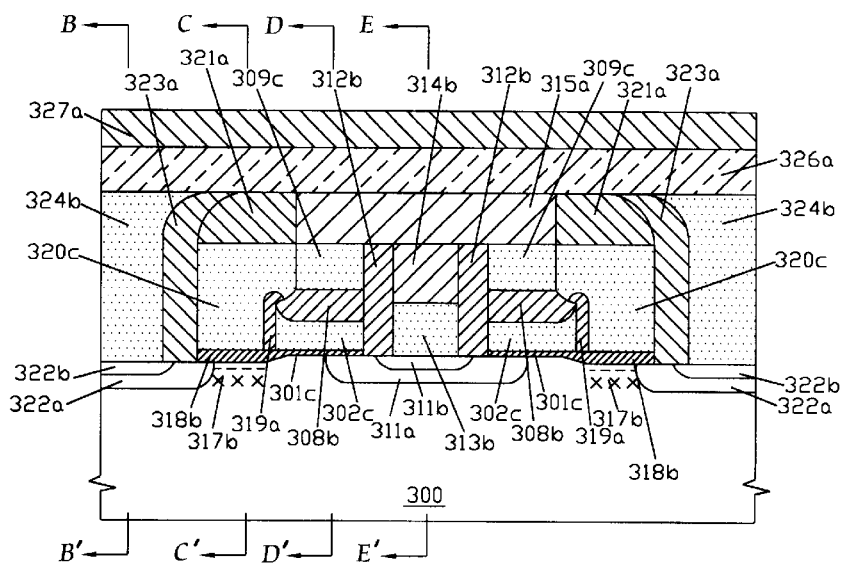
Figure 4M:
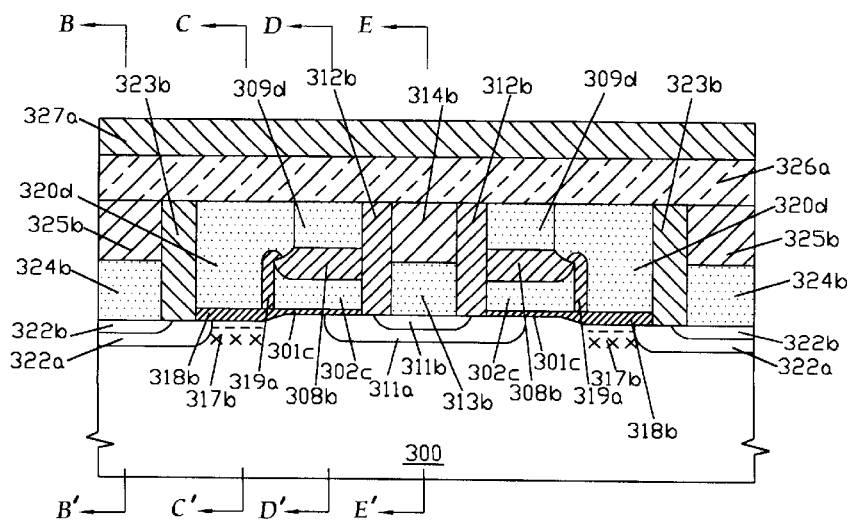

FIG. 4M(a) shows that a first interconnect-metal layer 326 being formed over the structure shown in FIG. 4L(a) together with the planarized fifth conductive layers 324a are simultaneously patterned and etched to form a plurality of bit lines 326a and a plurality of the planarized fifth conductive islands 324b by using a set of hard masking layers, wherein each of hard masking layers includes a masking dielectric layer 327a being aligned above the active region and two sidewall dielectric spacers 328a (shown in FIG. 5) being formed over each sidewall of the masking dielectric layer 327a. The various cross-sectional views shown in FIG. 4M(a) are shown in FIG. 5A through FIG. 5D, respectively.

FIG. 4M(b) shows that the planarized dielectric layer 315a in each of the first virtual-gate regions and the second planarized thick-oxide layer 325a in each of the common-drain regions are etched back first to a thickness of the planarized dielectric layer 315a, then the second sidewall dielectric spacer 323a and the fifth sidewall dielectric spacer 321a in each of the second virtual-gate regions are etched back to a similar depth; and a first interconnect-metal layer 326 being formed over a flat surface together with the second conductive layers 309c and the fourth conductive layers 320c are simultaneously patterned and etched to form a plurality of word lines 326a and a plurality of planarized control/select-gate conductive islands 320d, 309d by using a set of hard masking layers, wherein each of hard masking layers includes a masking dielectric layer 327a being aligned above the active region and two sidewall dielectric spacers 328a (shown in FIG. 6) being formed over each sidewall of the masking dielectric layer 327a. The various cross-sectional views as indicated in FIG. 4M(b) are shown in FIG. 6A through FIG. 6D, respectively.

Figure 5A:
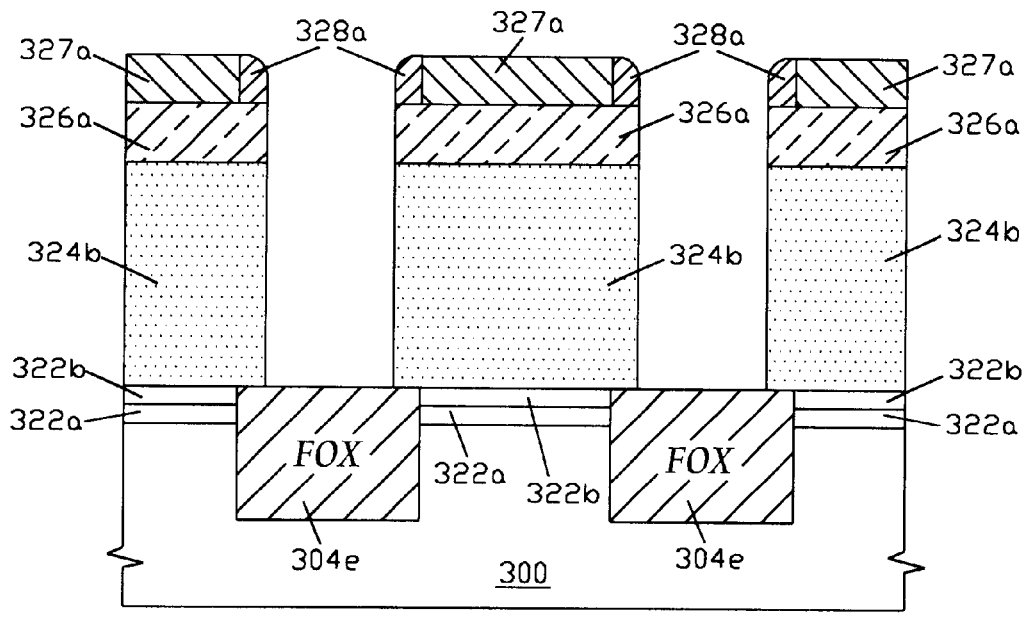
FIG. 5A through FIG. 5D show various cross-sectional views of a contactless NOR-type self-aligned split-gate flash memory array of the present invention as indicated in FIG. 4M($a$).

Referring now to FIG. 5A through FIG. 5D, there are shown various cross-sectional views as indicated in FIG. 4M(a). FIG. 5A shows a cross-sectional view along each of the common-drain regions as indicated by the B–B' line shown in FIG. 4M(a), in which a plurality of bit-lines 326a together with a plurality of planarized fifth conductive islands 324b being patterned and etched by a set of hard masking layers are formed over a second flat bed being alternately formed by an etched second raised field-oxide layer 304e and a shallow heavily-doped diffusion region 322b being formed within a common-drain diffusion region 322a; and each of hard masking layers includes a masking dielectric layer 327a being aligned above the active region and two sidewall dielectric spacers 328a being formed over each sidewall of the masking dielectric layer 327a to eliminate misalignment.

Figure 5B:
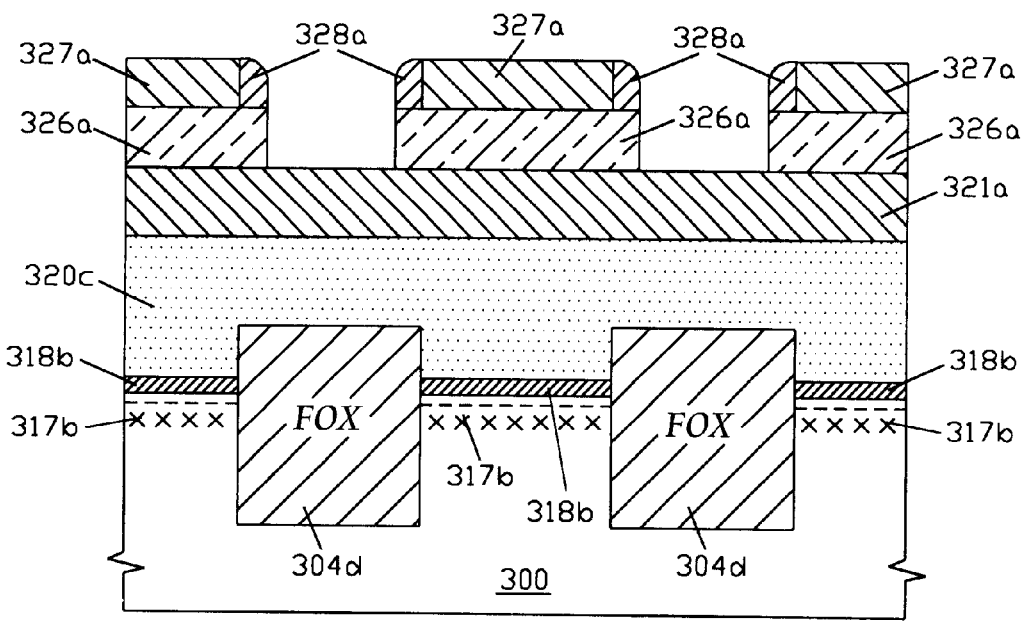

FIG. 5B shows a cross-sectional view along each of the select-gate regions as indicated by the C–C' line shown in FIG. 4M(a), in which the planarized control/select-gate conductive layer 320c is alternately formed over a second raised field-oxide layer 304d and a second gate-dielectric layer 318b; the fifth sidewall dielectric spacer 321a is formed over the planarized control/select-gate conductive layer 320c; and a plurality of bit lines 326a being formed over the fifth sidewall dielectric spacer 321a are patterned and etched by a set of hard masking layers as described. The implanted region 317b of a first conductivity type being formed under the second gate-dielectric layer 318a includes a shallow implant region as indicated by the dash line for threshold-voltage adjustment and a deep implant region as indicated by the cross symbols for forming a punch-through stop.

Figure 5C:
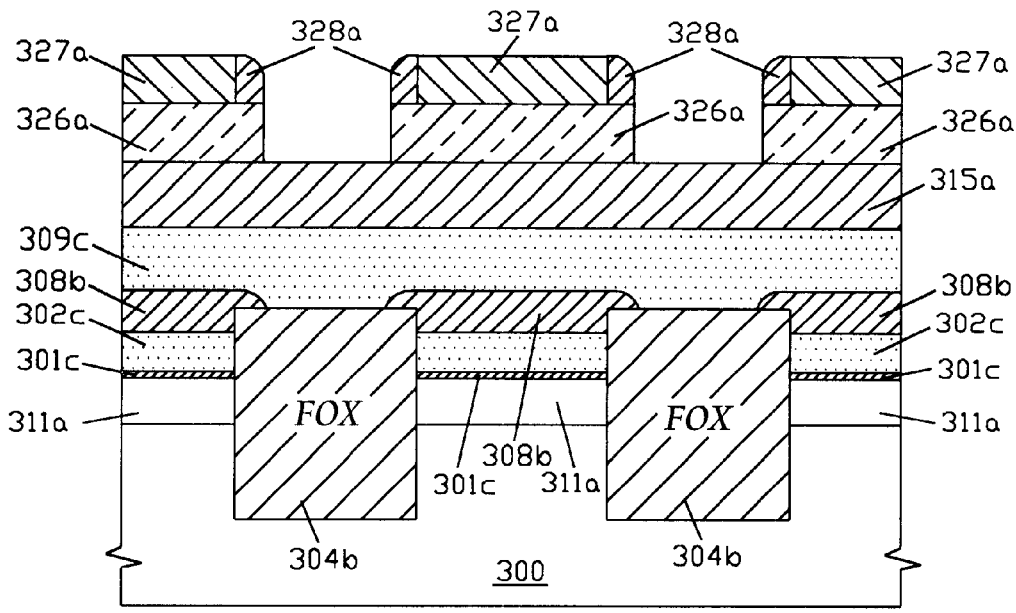

FIG. 5C shows a cross-sectional view along the floating-gate region as indicated by the D–D' line shown in FIG. 4M(a), in which a first poly-oxide layer 308b being formed by LOCOS is formed over the floating-gate layer 302c and a portion of nearby first raised field-oxide layers 304b; a planarized control/select-gate conductive layer 309c is alternately formed over the first raised field-oxide layer 304b and the first poly-oxide layer 308b; a planarized dielectric layer 315a is formed over the planarized control/select-gate conductive layer 309c; a plurality of bit lines 326a are patterned and etched by a set of hard masking layers as described; and a common-source diffusion region 311a is formed under the first-gate dielectric layer 301c.

Figure 5D:
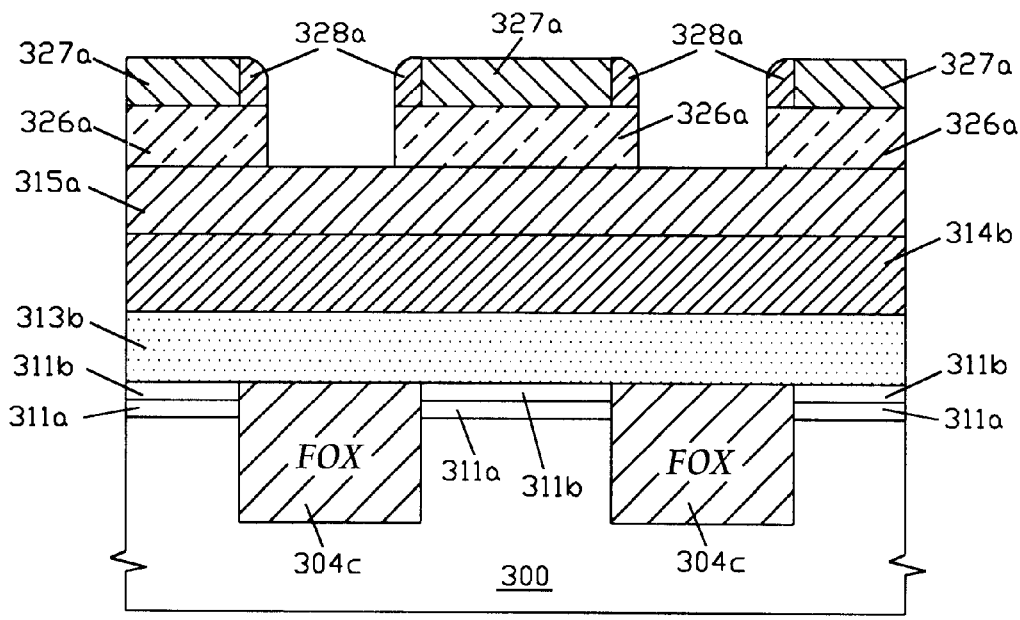

FIG. 5D shows a cross-sectional view along the common-source region as indicated by the E–E' line shown in FIG. 4M(a), in which the third conductive layer 313b is formed over a first flat bed being alternately formed by an etched first raised field-oxide layer 304c and a shallow heavily-doped source diffusion region 311b being formed within a common-source diffusion region 311a; a first planarized thick-oxide layer 314b is formed over the third conductive layer 313b: a planarized dielectric layer 315a is formed over the first planarized thick-oxide layer 314b; and a plurality of bit lines 326a being patterned and etched by a set of hard masking layers as described are formed over the planarized dielectric layer 315a.

Figure 6A:
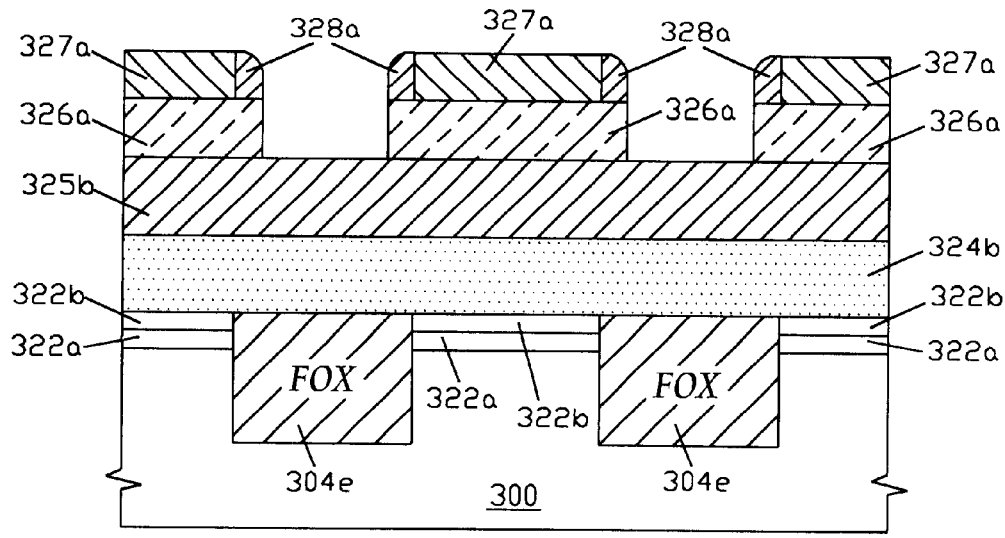
FIG. 6A through FIG. 6D show various cross-sectional views of a contactless parallel common-source/drain conductive bit-lines self-aligned flash memory array of the present invention as indicated in FIG. 4M($b$).

Referring now to FIG. 6A through FIG. 6D, there are shown various cross-sectional views shown in FIG. 4M(b). FIG. 6A shows a cross-sectional view along each of the common-drain regions as indicated by the B–B' line shown in FIG. 4M(b), in which a fifth conductive layer 324b is formed over a second flat bed being alternately formed by an etched second raised field-oxide layer 304e and a shallow heavily-doped drain diffusion region 322b of a second conductivity type being formed within a common-drain diffusion region 322a; a second planarized thick-oxide layer 325b is formed over the fifth conductive layer 324b; and a plurality of word lines 326a being formed over the second planarized thick-oxide layer 325b are patterned and etched by a set of hard masking layers as described in FIG. 5A.

Figure 6B:
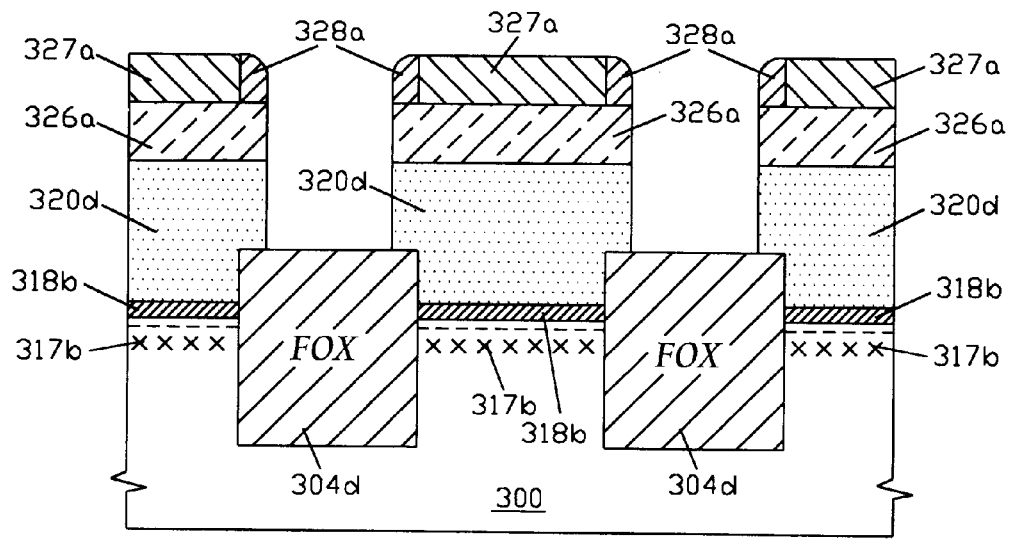

FIG. 6B shows a cross-sectional view along each of the select-gate regions as indicated by the C–C' line shown in FIG. 4M(b), in which a plurality of word lines 326a together with a plurality of planarized control/select-gate conductive islands 320d are patterned and etched by a set of hard masking layers as described, and each of the planarized control/select-gate conductive islands 320d is formed over the second gate-dielectric layer 318b and a portion of nearby second raised field-oxide layers 304d. An implanted region 317b of a first conductivity type is formed under the second gate-dielectric layer 318b between the nearby second raised field-oxide layers 304d, which includes a shallow implant region as indicated by the dash line for threshold-voltage adjustment and a deep implant region as indicated by the cross symbols for forming a punch-through stop.

Figure 6C:
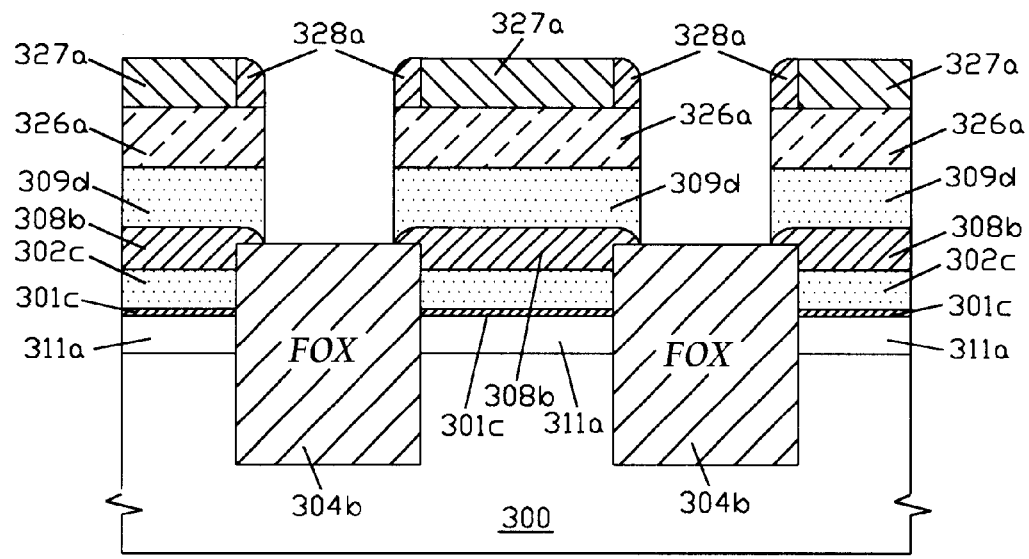

FIG. 6C shows a cross-sectional view along the floating-gate region as indicated by the D–D' line shown in FIG. 4M(b), in which a plurality of word lines 326a together with a plurality of planarized control/select-gate conductive islands 309d being simultaneously patterned and etched by a set of hard masking layers as described are formed on the first poly-oxide layers 308b being formed by LOCOS; the first poly-oxide layer 308b is formed on the floating-gate layer 302c and a portion of nearby first raised field-oxide layers 304b; the floating-gate layer 302c is formed on a first gate-dielectric layer 301c; and the first gate-dielectric layer 301c is formed over the common-source diffusion region 311a.

Figure 6D:
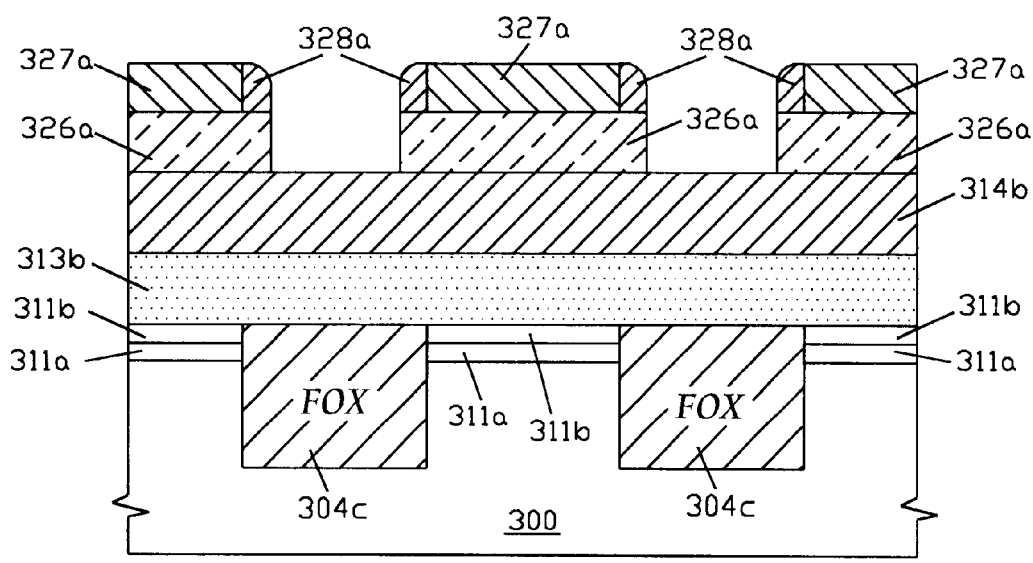

FIG. 6D shows a cross-sectional view along each of the common-source regions as indicated by the E–E' line shown in FIG. 4M(b), in which a third conductive layer 313b is formed over a first flat bed being alternately formed by an etched first raised field-oxide layer 304c and a shallow heavily-doped source diffusion region 311b being formed within a common-source diffusion region 311a; a first planarized thick-oxide layer 314b is formed over the third conductive layer 313b; and a plurality of word lines 326a being formed over the first planarized thick-oxide layer 314b are patterned and etched by a set of hard masking layers as described.

While the present invention has been particularly shown and described with a reference to the present examples and embodiments as considered as illustrative and not restrictive. Moreover, the present invention is not to be limited to the details given herein, it will be understood by those skilled in the art that various changes in form and details may be made without departure from the true spirit and scope of the present invention.

What is claimed is:

1. A self-aligned split-gate flash memory cell having a single-side tip-shaped floating gate structure, comprising:

a semiconductor substrate of a first conductivity type having an active region isolated by two parallel shallow-trench-isolation (STI) regions, wherein each of said two parallel STI regions is filled with a first raised field-oxide layer;

a cell region being formed on said semiconductor substrate and divided into three regions: a common-source region, a gate region, and a common-drain region, wherein said gate region is located between said common-source region and said common-drain region;

said common-source region comprises a first sidewall dielectric spacer being formed over a sidewall of said gate region and on a portion of a first flat bed being formed by a common-source diffusion region of a second conductivity type in said active region and two etched first raised field-oxide layers in said two parallel STI regions;

said common-drain region comprises a second sidewall dielectric spacer being formed over another sidewall of said gate region and on a portion of a second flat bed being formed by a common-drain diffusion region of said second conductivity type in said active region and two etched second raised field-oxide layers in said two parallel STI regions; and a self-aligned split-gate structure being formed in said gate region and comprising: a single-side tip-shaped floating-gate structure being formed on a first gate-dielectric layer; a first intergate-dielectric layer being formed over the single-side tip-shaped floating-gate structure; a second intergate-dielectric layer being formed over an inner sidewall of said single-side tip-shaped floating-gate structure and its tip portion; and a planarized control/select-gate conductive layer having a portion formed at least on a second gate-dielectric layer, said second intergate-dielectric layer, said first intergate-dielectric layer, and a portion of nearby said first/second raised field-oxide layers.

2. The self-aligned split-gate flash memory cell according to claim 1, wherein an implanted region of said first conductivity type comprising a shallow implant region for threshold-voltage adjustment and a deep implant region for forming a punch-through stop is formed in said semiconductor substrate under said second gate-dielectric layer.

3. The self-aligned split-gate flash memory cell according to claim 1, wherein said single-side tip-shaped floating-gate structure is formed by a well-known local-oxidation of silicon (LOCOS) process and said first intergate-dielectric layer is a poly-oxide layer being formed by said LOCOS process.

4. The self-aligned split-gate flash memory cell according to claim 3, wherein said poly-oxide layer formed by said LOCOS process is removed and replaced by a thermal poly-oxide or nitrided thermal poly-oxide layer or a composite dielectric layer such as an oxide-nitride-oxide (ONO) structure.

5. The self-aligned split-gate flash memory cell according to claim 1, wherein the gate length of said single-side tip-shaped floating-gate structure is defined by a sidewall dielectric spacer being formed over a portion of said planarized control/select-gate conductive layer to define an outer gate edge and another sidewall dielectric spacer being at least formed over a tip portion of said single-side tip-shaped floating-gate structure to define an inner floating-gate edge.

6. A contactless NOR-type self-aligned split-gate flash memory array, comprising:

a semiconductor substrate of a first conductivity type having a plurality of active regions and a plurality of parallel shallow-trench-isolation (STI) regions formed alternately, wherein each of the plurality of parallel STI regions is filled with a first raised field-oxide layer;

a plurality of common-source regions and a plurality of virtual-gate regions being formed alternately and transversely to the plurality of parallel STI regions, wherein each of the plurality of virtual-gate regions includes a pair of self-aligned split-gate regions being located in each side portion and a common-drain region being located between the pair of self-aligned split-gate regions;

each of the plurality of common-source regions comprises a pair of first sidewall dielectric spacers being formed over each sidewall of nearby said virtual-gate regions and on a portion of a first flat bed being alternately formed by an etched first raised field-oxide layer in said parallel STI region and a common-source diffusion region of a second conductivity type in said active region; a common-source conductive bus line being formed over said first flat bed between the pair of first sidewall dielectric spacers; and a first planarized thick-oxide layer being formed over said common-source conductive bus line;

said common-drain region comprises a pair of second sidewall dielectric spacers being formed over each sidewall of nearby said self-aligned split-gate regions and on a portion of a second flat bed being alternately formed by an etched second raised field-oxide layer in said parallel STI region and a common-drain diffusion region of said second conductivity type in said active region; a plurality of planarized common-drain conductive islands being at least formed over said common-drain diffusion regions between the pair of second sidewall dielectric spacers;

each of the pair of self-aligned split-gate regions comprises a single-side tip-shaped floating-gate structure being alternately formed on a first gate-dielectric layer in said active region with a first intergate-dielectric layer being formed on its top and a second intergate-dielectric layer being formed over its inner sidewall and tip portion; and an elongated planarized control/select-gate conductive layer acted as a word line being formed over a surface alternately formed by a second gate-dielectric layer and said first/second intergate-dielectric layers in said active region and said first/second raised field-oxide layers in said parallel STI region; and a plurality of first interconnect-metal layer integrated with the plurality of planarized common-drain conductive islands being simultaneously patterned and etched to form a plurality of bit lines transversely to the plurality of common-source conductive bus lines by using a plurality of hard masking layers, wherein each of the plurality of hard masking layers comprises a masking dielectric layer being aligned above said active region and two sidewall dielectric spacers being formed over each sidewall of said masking dielectric layer.

7. The contactless NOR-type self-aligned split-gate flash memory array according to claim 6, wherein said common-source conductive bus line comprises a doped polycrystalline-silicon layer being further implanted with a high dose of doping impurities to act as a dopant diffusion source for forming a shallow heavily-doped diffusion region of said second conductivity type within said common-source diffusion region.

8. The contactless NOR-type self-aligned split-gate flash memory array according to claim 6, wherein said common-source conductive bus line is comprises a polycide structure having a tungsten-silicide ($WSi_2$) layer formed over a heavily-implanted polycrystalline-silicon layer or a tungsten (W) layer lined with a barrier-metal layer such as a titanium-nitride (TiN) or tantalum-nitride (TaN) layer.

9. The contactless NOR-type self-aligned split-gate flash memory array according to claim 6, wherein said planarized common-drain conductive island comprises a composite conductive layer structure comprising a heavily-doped polycrystalline-silicon plug being capped with a metal-silicide layer, a tungsten plug lined with a barrier-metal layer, or a tungsten plug formed within a heavily-doped thin polycrystalline-silicon layer.

10. The contactless NOR-type self-aligned split-gate flash memory array according to claim 6, wherein said single-side tip-shaped floating-gate structure is formed by a local-oxidation of silicon (LOCOS) process and said first intergate dielectric layer is a poly-oxide layer being formed by said LOCOS process.

11. The contactless NOR-type self-aligned split-gate flash memory array according to claim 6, wherein said single-side tip-shaped floating-gate structure is preferably formed by a LOCOS process or an isotropic etching process and said first intergate dielectric layer is preferably a thermal poly-oxide or nitrided thermal poly-oxide layer or a composite dielectric layer comprising an oxide-nitride-oxide (ONO) structure.

12. A contactless NOR-type self-aligned split-gate flash memory array according to claim 6, wherein each gate length of said single-side tip-shaped floating-gate structures is defined by a sidewall dielectric spacer being formed over a portion of said elongated control/select-gate conductive layer to define an outer gate edge and another sidewall dielectric spacer being at least formed over a tip portion of said single-side tip-shaped floating-gate structure to define an inner floating-gate edge.

13. The contactless NOR-type self-aligned split-gate flash memory array according to claim 6, wherein said elongated planarized control/select-gate conductive layer comprises a of doped polycrystalline-silicon and is preferably capped with a tungsten-silicide ($WSi_2$) layer.

14. A contactless parallel common-source/drain conductive bit-lines flash memory array, comprising:

a semiconductor substrate of a first conductivity type having a plurality of active regions and a plurality of parallel STI regions formed alternately, wherein each of the plurality of parallel STI regions is filled with a first raised field-oxide layer;

a plurality of common-source regions and a plurality of virtual-gate regions being formed alternately and transversely to the plurality of parallel STI regions, wherein each of the plurality of virtual-gate regions includes a pair of self-aligned split-gate regions being located in each side portion and a common-drain region being located between the pair of self-aligned split-gate regions;

each of the plurality of common-source regions comprises a pair of first sidewall dielectric spacers being formed over each sidewall of nearby said virtual-gate regions and on a portion of a first flat bed being alternately formed by an etched first raised field-oxide layer in said parallel STI region and a common-source diffusion region of a second conductivity type in said active region; a common-source conductive bus line being formed over said first flat bed between the pair of first sidewall dielectric spacers; and a first planarized thick-oxide layer being formed over said common-source conductive bus line;

said common-drain region comprises a pair of second sidewall dielectric spacers being formed over each sidewall of nearby said self-aligned split-gate regions and on a portion of a second flat bed being alternately formed by an etched second raised field-oxide layer in said parallel STI region and a common-drain diffusion region of said second conductivity type in said active region; a common-drain conductive bus line being formed over said second flat bed between the pair of second sidewall dielectric spacers; and a second planarized thick-oxide layer being formed over said common-drain conductive bus line;

each of the pair of self-aligned split-gate regions comprises a single-side tip-shaped floating-gate structure being alternately formed on a first gate-dielectric layer in each of said active regions with a first intergate-dielectric layer being formed on its top and a second intergate-dielectric layer being formed over its inner sidewall and tip portion; and a planarized control/select-gate conductive island being at least formed alternately over a second gate-dielectric layer and the first/second intergate-dielectric layers in said active region and a portion of said first/second raised field-oxide layers in said parallel STI region; and a plurality of first interconnect-metal layers integrated with the plurality of planarized control/select-gate conductive islands being simultaneously patterned and etched to form a plurality of word lines transversely to the plurality of common-source/drain conductive bus lines by using a plurality of hard masking layers, wherein each of the plurality of hard masking layers comprises a masking dielectric layer being aligned above said active region and two sidewall dielectric spacers being formed over each sidewall of said masking dielectric layer.

15. The contactless parallel common-source/drain bit-lines flash memory array according to claim 14, wherein said common-source/drain conductive bus line comprises a doped polycrystalline-silicon layer being further implanted with a high dose of doping impurities to act as a dopant diffusion source for forming a shallow heavily-doped diffusion region of said second conductivity type within said common source/drain diffusion region.

16. The contactless parallel common-source/drain bit-lines flash memory array according to claim 14, wherein said common-source/drain conductive bus line comprises a polycide layer having a tungsten-silicide ($WSi_2$) layer formed over a heavily-implanted polycrystalline-silicon layer or a tungsten-layer lined with a barrier-metal layer comprising a titanium-nitride (TiN) or tantalum-nitride (TaN) layer.

17. The contactless parallel common-source/drain bit-lines flash memory array according to claim 14, wherein said single-side tip-shaped floating-gate structure is formed by a local-oxidation of silicon (LOCOS) process and said first intergate- dielectric layer is a poly-oxide layer being formed by said LOCOS process.

18. The contactless parallel common-source/drain bit-lines flash memory array according to claim 14, wherein said single-side tip-shaped floating-gate structure is formed by a LOCOS process or an isotropic etching process and said first intergate dielectric layer comprises a thermal poly-oxide or nitrided thermal poly-oxide layer or a composite dielectric layer comprising an oxide-nitride-oxide (ONO) structure.

19. The contactless parallel common-source/drain bit-lines flash memory array according to claim 14, wherein each gate length of said single-side tip-shaped floating-gate structures is defined by a sidewall dielectric spacer being formed over a portion of said planarized control/select-gate conductive islands to define an outer gate edge and another sidewall dielectric spacer being formed at least over a tip portion of said single-side tip-shaped floating-gate structure to define an inner floating-gate edge.

20. The contactless parallel common-source/drain bit-lines flash memory array according to claim 14, wherein said planarized control/select-gate conductive island comprises a doped polycrystalline-silicon and is silicided with a refractory-metal silicide layer comprising a titanium-silicide ($TiSi_2$) or cobalt-silicide ($CoSi_2$) layer.

* * * * *